United States Patent
Inaba et al.

(10) Patent No.: US 9,857,107 B2
(45) Date of Patent: Jan. 2, 2018

(54) THERMOELECTRIC DEVICE WITH INTERNAL SENSOR

(71) Applicant: Gentherm Incorporated, Northville, MI (US)

(72) Inventors: Masahiko Inaba, Chino Hills, CA (US); Jay Christopher Clark, Arcadia, CA (US); Brian Comiskey, Tustin, CA (US)

(73) Assignee: GENTHERM INCORPORATED, Northville, MI (US)

( * ) Notice: Subject to any disclaimer, the term of this patent is extended or adjusted under 35 U.S.C. 154(b) by 284 days.

(21) Appl. No.: 14/552,130

(22) Filed: Nov. 24, 2014

(65) Prior Publication Data

US 2015/0176870 A1 Jun. 25, 2015

Related U.S. Application Data

(63) Continuation of application No. 11/546,928, filed on Oct. 12, 2006, now abandoned.

(51) Int. Cl.
| | | |
|---|---|---|
| *F25B 21/02* | (2006.01) | |
| *H01L 35/32* | (2006.01) | |
| *B60N 2/56* | (2006.01) | |

(52) U.S. Cl.
CPC ............ *F25B 21/02* (2013.01); *B60N 2/5692* (2013.01); *H01L 35/32* (2013.01)

(58) Field of Classification Search
CPC ................................ H01L 35/32; F25B 21/02
USPC ..... 136/200, 203–204, 221–234; 62/3.2, 3.3, 62/3.5; 236/49.3
See application file for complete search history.

(56) References Cited

U.S. PATENT DOCUMENTS

| | | | |
|---|---|---|---|
| 1,839,156 A | 12/1931 | Lumpkin | |
| 2,235,620 A | 3/1941 | Nessell | |
| 2,362,259 A | 11/1944 | Findley | |
| 2,363,168 A | 11/1944 | Findley | |
| 2,461,432 A | 2/1949 | Mitchell | |

(Continued)

FOREIGN PATENT DOCUMENTS

| | | |
|---|---|---|
| CA | 979490 | 12/1975 |
| CN | 101 219 025 | 7/2008 |

(Continued)

OTHER PUBLICATIONS

U.S. Appl. No. 15/145,445, filed May 3, 2016, Lofy.

(Continued)

*Primary Examiner* — Brian Walck
(74) *Attorney, Agent, or Firm* — Knobbe, Martens, Olson & Bear LLP

(57) ABSTRACT

A thermoelectric system which comprises two substrates spaced apart from each other to form a gap and a plurality of electrically-connected semiconductor elements disposed between the substrates in the gap. The thermoelectric system further comprises at least one sensor and a seal which extends between the substrates and encloses the sensor and at least one of the plurality of semiconductor elements. The sensor is disposed between the substrates at an interior location spaced from the peripheral edge of at least one of the substrates. Additionally, at least one of the semiconductor elements is disposed between the sensor and the peripheral edge.

25 Claims, 7 Drawing Sheets

(56) References Cited

U.S. PATENT DOCUMENTS

| | | |
|---|---|---|
| 2,462,984 A | 3/1949 | Maddison |
| 2,493,067 A | 1/1950 | Goldsmith |
| 2,512,559 A | 6/1950 | Williams |
| 2,519,241 A | 8/1950 | Findley |
| 2,782,834 A | 2/1957 | Vigo |
| 2,791,956 A | 5/1957 | Guest |
| 2,813,708 A | 11/1957 | Frey |
| 2,884,956 A | 5/1959 | Perlin |
| 2,931,286 A | 4/1960 | Fry, Sr. et al. |
| 2,959,017 A | 11/1960 | Gilman et al. |
| 2,976,700 A | 3/1961 | Jackson |
| 2,984,077 A | 5/1961 | Gaskill |
| 3,019,609 A | 2/1962 | Pietsch |
| 3,030,145 A | 4/1962 | Kottemann |
| 3,039,817 A | 6/1962 | Taylor |
| 3,077,079 A | 2/1963 | Pietsch |
| 3,085,405 A | 4/1963 | Frantti |
| 3,090,206 A | 5/1963 | Anders |
| 3,136,577 A | 6/1964 | Richard |
| 3,137,142 A | 6/1964 | Venema |
| 3,137,523 A | 6/1964 | Karner |
| 3,138,934 A | 6/1964 | Roane |
| 3,178,894 A | 4/1965 | Mole et al. |
| 3,186,240 A | 6/1965 | Daubert |
| 3,197,342 A | 7/1965 | Neild |
| 3,212,275 A | 10/1965 | Tillman |
| 3,240,628 A | 3/1966 | Sonntag, Jr. |
| 3,253,649 A | 5/1966 | Laing |
| 3,266,064 A | 8/1966 | Figman |
| 3,282,267 A | 11/1966 | Eidus |
| 3,298,195 A | 1/1967 | Raskhodoff |
| 3,300,649 A | 1/1967 | Strawn |
| 3,325,312 A | 6/1967 | Sonntag, Jr. |
| 3,326,727 A | 6/1967 | Fritts |
| 3,351,498 A | 11/1967 | Shinn et al. |
| 3,366,164 A | 1/1968 | Newton |
| 3,392,535 A | 7/1968 | De Castelet |
| 3,486,177 A | 12/1969 | Marshack |
| 3,529,310 A | 9/1970 | Olmo |
| 3,550,523 A | 12/1970 | Segal |
| 3,599,437 A | 8/1971 | Panas |
| 3,615,870 A | 10/1971 | Crouthamel |
| 3,627,299 A | 12/1971 | Schwarze et al. |
| 3,632,451 A | 1/1972 | Abbott |
| 3,640,456 A | 2/1972 | Sturgis |
| 3,648,469 A | 3/1972 | Chapman |
| 3,703,141 A | 11/1972 | Pernoud |
| 3,767,470 A | 10/1973 | Hines |
| 3,786,230 A | 1/1974 | Brandenburg, Jr. |
| 3,819,418 A | 6/1974 | Winkler et al. |
| 3,839,876 A | 10/1974 | Privas |
| 3,870,568 A | 3/1975 | Oesterhelt et al. |
| 3,876,860 A | 4/1975 | Nomura et al. |
| 3,894,213 A | 7/1975 | Agarwala |
| 3,899,054 A | 8/1975 | Huntress et al. |
| 3,902,923 A | 9/1975 | Evans et al. |
| 3,916,151 A | 10/1975 | Reix |
| 3,926,052 A | 12/1975 | Bechtel |
| 3,927,299 A | 12/1975 | Sturgis |
| 3,928,876 A | 12/1975 | Starr |
| 4,002,108 A | 1/1977 | Drori |
| 4,044,824 A | 8/1977 | Eskeli |
| 4,124,794 A | 11/1978 | Eder |
| 4,195,687 A | 4/1980 | Taziker |
| 4,223,205 A | 9/1980 | Sturgis |
| 4,224,565 A | 9/1980 | Sosniak et al. |
| 4,281,516 A | 8/1981 | Berthet et al. |
| 4,315,599 A | 2/1982 | Biancardi |
| 4,336,444 A | 6/1982 | Bice et al. |
| 4,338,944 A | 7/1982 | Arkans |
| 4,391,009 A | 7/1983 | Schild et al. |
| 4,413,857 A | 11/1983 | Hayashi |
| 4,423,308 A | 12/1983 | Callaway et al. |
| 4,437,702 A | 3/1984 | Agosta |
| 4,438,070 A | 3/1984 | Stephens et al. |
| 4,459,428 A | 7/1984 | Chou |
| 4,491,173 A | 1/1985 | Demand |
| 4,493,939 A | 1/1985 | Blaske et al. |
| 4,497,973 A | 2/1985 | Heath et al. |
| 4,506,510 A | 3/1985 | Tircot |
| 4,518,700 A | 5/1985 | Stephens |
| 4,518,847 A | 5/1985 | Horst, Sr. et al. |
| 4,549,134 A | 10/1985 | Weiss |
| 4,554,968 A | 11/1985 | Haas |
| 4,567,351 A | 1/1986 | Kitagawa et al. |
| 4,572,430 A | 2/1986 | Takagi et al. |
| 4,639,883 A | 1/1987 | Michaelis |
| 4,665,707 A | 5/1987 | Hamilton |
| 4,671,567 A | 6/1987 | Frobose |
| 4,677,416 A | 6/1987 | Nishimoto et al. |
| 4,685,727 A | 8/1987 | Cremer et al. |
| 4,688,390 A | 8/1987 | Sawyer |
| 4,704,320 A | 11/1987 | Mizunoya et al. |
| 4,711,294 A | 12/1987 | Jacobs et al. |
| 4,712,832 A | 12/1987 | Antolini et al. |
| 4,777,802 A | 10/1988 | Feher |
| 4,782,664 A | 11/1988 | Sterna et al. |
| 4,791,274 A | 12/1988 | Horst |
| 4,793,651 A | 12/1988 | Inagaki et al. |
| 4,802,929 A | 2/1989 | Schock |
| 4,812,733 A | 3/1989 | Tobey |
| 4,823,554 A | 4/1989 | Trachtenberg et al. |
| 4,825,488 A | 5/1989 | Bedford |
| 4,828,627 A | 5/1989 | Connery |
| 4,853,992 A | 8/1989 | Yu |
| 4,923,248 A | 5/1990 | Feher |
| 4,947,648 A | 8/1990 | Harwell et al. |
| 4,969,684 A | 11/1990 | Zarotti |
| 4,981,324 A | 1/1991 | Law |
| 4,988,847 A | 1/1991 | Argos et al. |
| 4,997,230 A | 3/1991 | Spitalnick |
| 5,002,336 A | 3/1991 | Feher |
| 5,012,325 A | 4/1991 | Mansuria et al. |
| 5,014,909 A | 5/1991 | Yasuo |
| 5,016,304 A | 5/1991 | Ryhiner |
| 5,022,462 A | 6/1991 | Flint et al. |
| 5,057,490 A | 10/1991 | Skertic |
| 5,070,937 A | 12/1991 | Mougin et al. |
| 5,077,709 A | 12/1991 | Feher |
| 5,088,790 A | 2/1992 | Wainwright et al. |
| 5,102,189 A | 4/1992 | Saito et al. |
| 5,106,161 A | 4/1992 | Meiller |
| 5,111,025 A | 5/1992 | Barma et al. |
| 5,111,664 A | 5/1992 | Yang |
| 5,117,638 A | 6/1992 | Feher |
| 5,119,640 A | 6/1992 | Conrad |
| 5,125,238 A | 6/1992 | Ragan et al. |
| 5,148,977 A | 9/1992 | Hibino et al. |
| 5,166,777 A | 11/1992 | Kataoka |
| 5,187,349 A | 2/1993 | Curhan et al. |
| 5,188,286 A | 2/1993 | Pence, IV |
| 5,255,735 A | 10/1993 | Raghava et al. |
| 5,256,857 A | 10/1993 | Curhan et al. |
| 5,265,599 A | 11/1993 | Stephenson et al. |
| 5,278,936 A | 1/1994 | Shao |
| 5,279,128 A | 1/1994 | Tomatsu et al. |
| 5,335,381 A | 8/1994 | Chang |
| 5,367,728 A | 11/1994 | Chang |
| 5,372,402 A | 12/1994 | Kuo |
| 5,375,421 A | 12/1994 | Hsieh |
| 5,382,075 A | 1/1995 | Shih |
| 5,385,382 A | 1/1995 | Single, II et al. |
| 5,409,547 A * | 4/1995 | Watanabe ............. H01L 35/32 |
| | | 136/201 |
| 5,413,166 A | 5/1995 | Kerner et al. |
| 5,416,935 A | 5/1995 | Nieh |
| 5,419,489 A | 5/1995 | Burd |
| 5,419,780 A | 5/1995 | Suski |
| 5,430,322 A | 7/1995 | Koyanagi et al. |
| 5,448,788 A | 9/1995 | Wu |
| 5,448,891 A | 9/1995 | Nakagiri et al. |
| 5,456,081 A | 10/1995 | Chrysler et al. |
| 5,473,783 A | 12/1995 | Allen |
| 5,493,742 A | 2/1996 | Klearman |

(56) References Cited

U.S. PATENT DOCUMENTS

| | | |
|---|---|---|
| 5,493,864 A | 2/1996 | Pomerene et al. |
| 5,505,520 A | 4/1996 | Frusti et al. |
| 5,515,238 A | 5/1996 | Fritz et al. |
| 5,524,439 A | 6/1996 | Gallup et al. |
| 5,542,503 A | 8/1996 | Dunn et al. |
| 5,544,487 A | 8/1996 | Attey et al. |
| 5,544,488 A | 8/1996 | Reid |
| 5,555,732 A | 9/1996 | Whiticar |
| 5,561,981 A | 10/1996 | Quisenberry et al. |
| 5,576,512 A | 11/1996 | Doke |
| 5,584,084 A | 12/1996 | Klearman et al. |
| 5,584,183 A | 12/1996 | Wright et al. |
| 5,597,200 A | 1/1997 | Gregory et al. |
| 5,601,399 A | 2/1997 | Okpara et al. |
| 5,606,639 A | 2/1997 | Lehoe et al. |
| 5,613,729 A | 3/1997 | Summer, Jr. |
| 5,613,730 A | 3/1997 | Buie et al. |
| 5,623,828 A | 4/1997 | Harrington |
| 5,626,021 A | 5/1997 | Karunasiri et al. |
| 5,626,386 A | 5/1997 | Lush |
| 5,634,342 A | 6/1997 | Peeters et al. |
| 5,637,921 A | 6/1997 | Burward-Hoy |
| 5,640,728 A | 6/1997 | Graebe |
| 5,642,539 A | 7/1997 | Kuo |
| 5,645,314 A | 7/1997 | Liou |
| 5,650,904 A | 7/1997 | Gilley et al. |
| 5,653,741 A | 8/1997 | Grant |
| 5,667,622 A | 9/1997 | Hasegawa et al. |
| 5,675,852 A | 10/1997 | Watkins |
| 5,690,849 A | 11/1997 | DeVilbiss et al. |
| 5,692,952 A | 12/1997 | Chih-Hung |
| 5,704,213 A | 1/1998 | Smith et al. |
| 5,715,695 A | 2/1998 | Lord |
| 5,721,804 A | 2/1998 | Greene, III |
| 5,724,818 A | 3/1998 | Iwata et al. |
| 5,729,981 A | 3/1998 | Markus et al. |
| 5,761,908 A | 6/1998 | Oas et al. |
| 5,761,909 A | 6/1998 | Hughes et al. |
| 5,798,583 A | 8/1998 | Morita |
| 5,802,855 A | 9/1998 | Yamaguchi et al. |
| 5,802,856 A | 9/1998 | Schaper et al. |
| 5,822,993 A | 10/1998 | Attey |
| 5,827,424 A | 10/1998 | Gillis et al. |
| 5,833,321 A | 11/1998 | Kim et al. |
| 5,850,741 A | 12/1998 | Feher |
| 5,865,031 A | 2/1999 | Itakura |
| 5,871,151 A | 2/1999 | Fiedrich |
| 5,884,485 A | 3/1999 | Yamaguchi et al. |
| 5,884,486 A | 3/1999 | Hughes et al. |
| 5,887,304 A | 3/1999 | Von der Heyde |
| 5,888,261 A | 3/1999 | Fortune |
| 5,895,964 A | 4/1999 | Nakayama |
| 5,902,014 A | 5/1999 | Dinkel et al. |
| 5,921,100 A | 7/1999 | Yoshinori et al. |
| 5,921,314 A | 7/1999 | Schuller et al. |
| 5,921,858 A | 7/1999 | Kawai et al. |
| 5,924,289 A | 7/1999 | Bishop, II |
| 5,924,766 A | 7/1999 | Esaki et al. |
| 5,924,767 A | 7/1999 | Pietryga |
| 5,927,817 A | 7/1999 | Ekman et al. |
| 5,934,748 A | 8/1999 | Faust et al. |
| 5,936,192 A | 8/1999 | Tauchi |
| 5,937,908 A | 8/1999 | Inoshiri et al. |
| 5,948,303 A | 9/1999 | Larson |
| 5,950,067 A | 9/1999 | Maegawa et al. |
| 5,952,728 A | 9/1999 | Imanishi et al. |
| 5,987,893 A | 11/1999 | Schulz-Harder et al. |
| 5,988,568 A | 11/1999 | Drews |
| 5,992,154 A | 11/1999 | Kawada et al. |
| 5,994,637 A | 11/1999 | Imanishi et al. |
| 5,995,711 A | 11/1999 | Fukuoka et al. |
| 6,000,225 A | 12/1999 | Ghoshal |
| 6,003,950 A | 12/1999 | Larsson |
| 6,006,524 A | 12/1999 | Park |
| 6,019,420 A | 2/2000 | Faust et al. |
| 6,038,865 A | 3/2000 | Watanabe et al. |
| 6,048,024 A | 4/2000 | Wallman |
| 6,049,655 A | 4/2000 | Vazirani |
| 6,052,853 A | 4/2000 | Schmid |
| 6,053,163 A | 4/2000 | Bass |
| 6,059,018 A | 5/2000 | Yoshinori et al. |
| 6,062,641 A | 5/2000 | Suzuki et al. |
| 6,072,924 A | 6/2000 | Sato et al. |
| 6,072,938 A | 6/2000 | Peterson et al. |
| 6,073,998 A | 6/2000 | Siarkowski et al. |
| 6,079,485 A | 6/2000 | Esaki et al. |
| 6,084,172 A | 7/2000 | Kishi et al. |
| 6,085,369 A | 7/2000 | Feher |
| 6,086,831 A | 7/2000 | Harness et al. |
| 6,087,638 A | 7/2000 | Silverbrook |
| 6,094,919 A | 8/2000 | Bhatia |
| 6,097,088 A | 8/2000 | Sakuragi |
| 6,100,463 A | 8/2000 | Ladd et al. |
| 6,101,815 A | 8/2000 | Van Oort et al. |
| 6,105,373 A | 8/2000 | Watanabe et al. |
| 6,109,688 A | 8/2000 | Wurz et al. |
| 6,112,525 A | 9/2000 | Yoshida et al. |
| 6,112,531 A | 9/2000 | Yamaguchi |
| 6,116,029 A | 9/2000 | Krawec |
| 6,119,463 A | 9/2000 | Bell |
| 6,120,370 A | 9/2000 | Asou et al. |
| 6,127,619 A | 10/2000 | Xi et al. |
| 6,141,969 A | 11/2000 | Launchbury et al. |
| 6,145,925 A | 11/2000 | Eksin et al. |
| 6,158,224 A | 12/2000 | Hu et al. |
| 6,161,241 A | 12/2000 | Zysman |
| 6,161,388 A | 12/2000 | Ghoshal |
| 6,164,076 A | 12/2000 | Chu et al. |
| 6,164,719 A | 12/2000 | Rauh |
| 6,171,333 B1 | 1/2001 | Nelson et al. |
| 6,178,292 B1 | 1/2001 | Fukuoka et al. |
| 6,179,706 B1 | 1/2001 | Yoshinori et al. |
| 6,186,592 B1 | 2/2001 | Orizakis et al. |
| 6,189,966 B1 | 2/2001 | Faust et al. |
| 6,189,967 B1 | 2/2001 | Short |
| 6,196,627 B1 | 3/2001 | Faust et al. |
| 6,196,839 B1 | 3/2001 | Ross |
| 6,206,465 B1 | 3/2001 | Faust et al. |
| 6,213,198 B1 | 4/2001 | Shikata et al. |
| 6,222,243 B1 | 4/2001 | Kishi et al. |
| 6,223,539 B1 | 5/2001 | Bell |
| 6,233,959 B1 | 5/2001 | Kang et al. |
| 6,250,083 B1 | 6/2001 | Chou |
| 6,256,996 B1 | 7/2001 | Ghoshal |
| 6,262,357 B1 | 7/2001 | Johnson et al. |
| 6,263,530 B1 | 7/2001 | Feher |
| 6,266,962 B1 | 7/2001 | Ghoshal |
| 6,282,907 B1 | 9/2001 | Ghoshal |
| 6,289,982 B1 | 9/2001 | Naji |
| 6,291,803 B1 | 9/2001 | Fourrey |
| 6,306,673 B1 | 10/2001 | Imanishi et al. |
| 6,326,610 B1 | 12/2001 | Muramatsu et al. |
| 6,336,237 B1 | 1/2002 | Schmid |
| 6,338,251 B1 | 1/2002 | Ghoshal |
| 6,341,395 B1 | 1/2002 | Chao |
| 6,347,521 B1 | 2/2002 | Kadotani et al. |
| 6,378,311 B1 | 4/2002 | McCordic |
| 6,385,976 B1 | 5/2002 | Yamamura et al. |
| 6,391,676 B1 | 5/2002 | Tsuzaki et al. |
| 6,393,842 B2 | 5/2002 | Kim et al. |
| 6,400,013 B1 | 6/2002 | Tsuzaki et al. |
| 6,402,470 B1 | 6/2002 | Kvasnak et al. |
| 6,410,971 B1 | 6/2002 | Otey |
| 6,425,527 B1 | 7/2002 | Smole |
| 6,427,449 B1 | 8/2002 | Logan et al. |
| 6,434,328 B2 | 8/2002 | Rutherford |
| 6,452,740 B1 | 9/2002 | Ghoshal |
| 6,470,696 B1 | 10/2002 | Palfy et al. |
| 6,474,073 B1 | 11/2002 | Uetsuji et al. |
| 6,481,801 B1 | 11/2002 | Schmale |
| 6,487,739 B1 | 12/2002 | Harker |
| 6,489,551 B2 | 12/2002 | Chu et al. |
| 6,490,879 B1 | 12/2002 | Lloyd et al. |
| 6,492,585 B1 | 12/2002 | Zamboni et al. |

(56) References Cited

U.S. PATENT DOCUMENTS

| | | |
|---|---|---|
| 6,493,888 B1 | 12/2002 | Salvatini et al. |
| 6,493,889 B2 | 12/2002 | Kocurek |
| 6,509,704 B1 | 1/2003 | Brown |
| 6,511,125 B1 | 1/2003 | Gendron |
| 6,519,949 B1 | 2/2003 | Wernlund et al. |
| 6,539,725 B2 | 4/2003 | Bell |
| 6,541,737 B1 | 4/2003 | Eksin et al. |
| 6,541,743 B2 | 4/2003 | Chen |
| 6,546,576 B1 | 4/2003 | Lin |
| 6,548,894 B2 | 4/2003 | Chu et al. |
| 6,552,256 B2 | 4/2003 | Shakouri et al. |
| RE38,128 E | 6/2003 | Gallup et al. |
| 6,571,564 B2 | 6/2003 | Upadhye et al. |
| 6,573,596 B2 | 6/2003 | Saika |
| 6,574,967 B1 | 6/2003 | Park et al. |
| 6,580,025 B2 | 6/2003 | Guy |
| 6,581,225 B1 | 6/2003 | Imai |
| 6,583,638 B2 | 6/2003 | Costello et al. |
| 6,598,251 B2 | 7/2003 | Habboub et al. |
| 6,598,405 B2 | 7/2003 | Bell |
| 6,604,576 B2 | 8/2003 | Noda et al. |
| 6,604,785 B2 | 8/2003 | Bargheer et al. |
| 6,605,955 B1 | 8/2003 | Costello et al. |
| 6,606,754 B1 | 8/2003 | Flick |
| 6,606,866 B2 | 8/2003 | Bell |
| 6,619,044 B2 | 9/2003 | Batchelor et al. |
| 6,619,736 B2 | 9/2003 | Stowe et al. |
| 6,625,990 B2 | 9/2003 | Bell |
| 6,626,488 B2 | 9/2003 | Pfahler |
| 6,629,724 B2 | 10/2003 | Ekern et al. |
| 6,637,210 B2 | 10/2003 | Bell |
| 6,644,735 B2 | 11/2003 | Bargheer et al. |
| 6,672,076 B2 | 1/2004 | Bell |
| 6,676,207 B2 | 1/2004 | Rauh et al. |
| 6,684,437 B2 | 2/2004 | Koenig |
| 6,686,532 B1 | 2/2004 | Macris |
| 6,687,937 B2 | 2/2004 | Harker |
| 6,695,402 B2 | 2/2004 | Sloan, Jr. |
| 6,700,052 B2 | 3/2004 | Bell |
| 6,705,089 B2 | 3/2004 | Chu et al. |
| 6,708,352 B2 | 3/2004 | Salvatini et al. |
| 6,711,767 B2 | 3/2004 | Klamm |
| 6,711,904 B1 | 3/2004 | Law et al. |
| 6,719,039 B2 | 4/2004 | Calaman et al. |
| 6,725,669 B2 | 4/2004 | Melaragni |
| 6,727,422 B2 | 4/2004 | Macris |
| 6,730,115 B1 | 5/2004 | Heaton |
| 6,739,138 B2 | 5/2004 | Saunders et al. |
| 6,739,655 B1 | 5/2004 | Schwochert et al. |
| 6,743,972 B2 | 6/2004 | Macris |
| 6,761,399 B2 | 7/2004 | Bargheer et al. |
| 6,764,502 B2 | 7/2004 | Bieberich |
| 6,767,766 B2 | 7/2004 | Chu et al. |
| 6,772,829 B2 | 8/2004 | Lebrun |
| 6,774,346 B2 | 8/2004 | Clothier |
| 6,786,541 B2 | 9/2004 | Haupt et al. |
| 6,786,545 B2 | 9/2004 | Bargheer et al. |
| 6,790,481 B2 | 9/2004 | Bishop et al. |
| 6,793,016 B2 | 9/2004 | Aoki et al. |
| 6,804,966 B1 | 10/2004 | Chu et al. |
| 6,808,230 B2 | 10/2004 | Buss et al. |
| 6,812,395 B2 | 11/2004 | Bell |
| 6,815,814 B2 | 11/2004 | Chu et al. |
| 6,817,191 B2 | 11/2004 | Watanabe |
| 6,817,197 B1 | 11/2004 | Padfield |
| 6,817,675 B2 | 11/2004 | Buss et al. |
| 6,818,817 B2 | 11/2004 | Macris |
| 6,823,678 B1 | 11/2004 | Li |
| 6,828,528 B2 | 12/2004 | Stowe et al. |
| 6,834,509 B2 | 12/2004 | Palfy et al. |
| 6,840,305 B2 | 1/2005 | Zheng et al. |
| 6,840,576 B2 | 1/2005 | Ekern et al. |
| 6,841,957 B2 | 1/2005 | Brown |
| 6,845,622 B2 | 1/2005 | Sauciuc et al. |
| 6,855,158 B2 | 2/2005 | Stolpmann |
| 6,855,880 B2 | 2/2005 | Feher |
| 6,857,697 B2 | 2/2005 | Brennan et al. |
| 6,857,954 B2 | 2/2005 | Luedtke |
| 6,868,690 B2 | 3/2005 | Faqih |
| 6,871,365 B2 | 3/2005 | Flick et al. |
| 6,886,351 B2 | 5/2005 | Palfy et al. |
| 6,892,807 B2 | 5/2005 | Fristedt et al. |
| 6,893,086 B2 | 5/2005 | Bajic et al. |
| 6,904,629 B2 | 6/2005 | Wu |
| 6,907,739 B2 | 6/2005 | Bell |
| 6,923,216 B2 | 8/2005 | Extrand et al. |
| 6,935,122 B2 | 8/2005 | Huang |
| 6,954,944 B2 | 10/2005 | Feher |
| 6,959,555 B2 | 11/2005 | Bell |
| 6,962,195 B2 | 11/2005 | Smith et al. |
| 6,963,053 B2 | 11/2005 | Lutz |
| 6,967,309 B2 | 11/2005 | Wyatt et al. |
| 6,976,734 B2 | 12/2005 | Stoewe |
| 6,977,360 B2 | 12/2005 | Weiss |
| 6,981,380 B2 | 1/2006 | Chrysler et al. |
| 6,990,701 B1 | 1/2006 | Litvak |
| 7,000,490 B1 | 2/2006 | Micheels |
| 7,036,163 B2 | 5/2006 | Schmid |
| 7,040,710 B2 | 5/2006 | White et al. |
| 7,052,091 B2 | 5/2006 | Bajic et al. |
| 7,063,163 B2 | 6/2006 | Steele et al. |
| 7,066,306 B2 | 6/2006 | Gavin |
| 7,070,231 B1 | 7/2006 | Wong |
| 7,070,232 B2 | 7/2006 | Minegishi et al. |
| 7,075,034 B2 | 7/2006 | Bargheer et al. |
| 7,082,772 B2 | 8/2006 | Welch |
| 7,084,502 B2 | 8/2006 | Bottner et al. |
| 7,100,978 B2 | 9/2006 | Ekern et al. |
| 7,108,319 B2 | 9/2006 | Hartwich et al. |
| 7,111,465 B2 | 9/2006 | Bell |
| 7,114,771 B2 | 10/2006 | Lofy et al. |
| 7,124,593 B2 | 10/2006 | Feher |
| 7,131,689 B2 | 11/2006 | Brennan et al. |
| 7,134,715 B1 | 11/2006 | Fristedt et al. |
| 7,141,763 B2 | 11/2006 | Moroz |
| 7,147,279 B2 | 12/2006 | Bevan et al. |
| 7,165,281 B2 | 1/2007 | Larssson et al. |
| 7,168,758 B2 | 1/2007 | Bevan et al. |
| 7,178,344 B2 | 2/2007 | Bell |
| 7,201,441 B2 | 4/2007 | Stoewe et al. |
| 7,213,876 B2 | 5/2007 | Stoewe |
| 7,220,048 B2 | 5/2007 | Kohlgrüber et al. |
| 7,224,059 B2 | 5/2007 | Shimada et al. |
| 7,231,772 B2 | 6/2007 | Bell |
| 7,244,887 B2 | 7/2007 | Miley |
| 7,246,496 B2 | 7/2007 | Goenka et al. |
| 7,272,936 B2 | 9/2007 | Feher |
| 7,273,981 B2 | 9/2007 | Bell |
| 7,299,639 B2 | 11/2007 | Leija et al. |
| 7,337,615 B2 | 3/2008 | Reidy |
| 7,338,117 B2 | 3/2008 | Iqbal et al. |
| 7,340,907 B2 | 3/2008 | Vogh |
| 7,355,146 B2 | 4/2008 | Angelis et al. |
| 7,356,912 B2 | 4/2008 | Iqbal et al. |
| 7,360,365 B2 | 4/2008 | Codecasa et al. |
| 7,360,416 B2 | 4/2008 | Manaka et al. |
| 7,370,479 B2 | 5/2008 | Pfannenberg |
| 7,370,911 B2 | 5/2008 | Bajic et al. |
| 7,380,586 B2 | 6/2008 | Gawthrop |
| 7,425,034 B2 | 9/2008 | Bajic et al. |
| 7,426,835 B2 | 9/2008 | Bell et al. |
| 7,462,028 B2 | 12/2008 | Cherala et al. |
| 7,469,432 B2 | 12/2008 | Chambers |
| 7,475,464 B2 | 1/2009 | Lofy et al. |
| 7,475,938 B2 | 1/2009 | Stoewe et al. |
| 7,478,869 B2 | 1/2009 | Lazanja et al. |
| 7,480,950 B2 | 1/2009 | Feher |
| 7,506,924 B2 | 3/2009 | Bargheer et al. |
| 7,506,938 B2 | 3/2009 | Brennan et al. |
| 7,513,273 B2 | 4/2009 | Bivin |
| 7,581,785 B2 | 9/2009 | Heckmann et al. |
| 7,587,901 B2 | 9/2009 | Petrovski |
| 7,587,902 B2 | 9/2009 | Bell |
| 7,591,507 B2 | 9/2009 | Giffin et al. |

(56) References Cited

U.S. PATENT DOCUMENTS

| | | |
|---|---|---|
| 7,608,777 B2 | 10/2009 | Bell et al. |
| 7,621,594 B2 | 11/2009 | Hartmann et al. |
| 7,640,754 B2 | 1/2010 | Wolas |
| 7,665,803 B2 | 2/2010 | Wolas |
| 7,708,338 B2 | 5/2010 | Wolas |
| 7,731,279 B2 | 6/2010 | Asada et al. |
| RE41,765 E | 9/2010 | Gregory et al. |
| 7,827,620 B2 | 11/2010 | Feher |
| 7,827,805 B2 | 11/2010 | Comiskey et al. |
| 7,862,113 B2 | 1/2011 | Knoll |
| 7,866,017 B2 | 1/2011 | Knoll |
| 7,877,827 B2 | 2/2011 | Marquette et al. |
| 7,937,789 B2 | 5/2011 | Feher |
| 7,963,594 B2 | 6/2011 | Wolas |
| 7,966,835 B2 | 6/2011 | Petrovski |
| 7,969,738 B2 | 6/2011 | Koo |
| 7,996,936 B2 | 8/2011 | Marquette et al. |
| 8,062,797 B2 | 11/2011 | Fisher et al. |
| 8,065,763 B2 | 11/2011 | Brykalski et al. |
| 8,104,295 B2 | 1/2012 | Lofy |
| 8,143,554 B2 | 3/2012 | Lofy |
| 8,181,290 B2 | 5/2012 | Brykalski et al. |
| 8,191,187 B2 | 6/2012 | Brykalski et al. |
| 8,222,511 B2 | 7/2012 | Lofy |
| 8,256,236 B2 | 9/2012 | Lofy |
| 8,332,975 B2 | 12/2012 | Brykalski et al. |
| 8,402,579 B2 | 3/2013 | Marquette et al. |
| 8,418,286 B2 | 4/2013 | Brykalski et al. |
| 8,434,314 B2 | 5/2013 | Comiskey et al. |
| 8,438,863 B2 | 5/2013 | Lofy |
| RE44,272 E | 6/2013 | Bell |
| 8,505,320 B2 | 8/2013 | Lofy |
| 8,516,842 B2 | 8/2013 | Petrovski |
| 8,539,624 B2 | 9/2013 | Terech et al. |
| 8,575,518 B2 | 11/2013 | Walsh |
| 8,621,687 B2 | 1/2014 | Brykalski et al. |
| 8,732,874 B2 | 5/2014 | Brykalski et al. |
| 8,782,830 B2 | 7/2014 | Brykalski et al. |
| 8,893,329 B2 | 11/2014 | Petrovski et al. |
| 9,105,808 B2 | 8/2015 | Petrovski |
| 9,105,809 B2 | 8/2015 | Lofy |
| 9,121,414 B2 | 9/2015 | Lofy et al. |
| 9,125,497 B2 | 9/2015 | Brykalski et al. |
| 9,335,073 B2 | 5/2016 | Lofy |
| 2001/0005990 A1 | 7/2001 | Kim et al. |
| 2001/0014212 A1 | 8/2001 | Rutherford |
| 2001/0028185 A1 | 10/2001 | Stowe et al. |
| 2002/0017102 A1 | 2/2002 | Bell |
| 2002/0062854 A1 | 5/2002 | Sharp |
| 2002/0092308 A1 | 7/2002 | Bell |
| 2002/0100121 A1 | 8/2002 | Kocurek |
| 2002/0108380 A1 | 8/2002 | Nelsen et al. |
| 2002/0121094 A1 | 9/2002 | VanHoudt |
| 2002/0195844 A1 | 12/2002 | Hipwell |
| 2003/0019044 A1 | 1/2003 | Larsson et al. |
| 2003/0039298 A1 | 2/2003 | Eriksson et al. |
| 2003/0041892 A1 | 3/2003 | Fleurial et al. |
| 2003/0070235 A1 | 4/2003 | Suzuki et al. |
| 2003/0084511 A1 | 5/2003 | Salvatini et al. |
| 2003/0110779 A1 | 6/2003 | Otey et al. |
| 2003/0133492 A1 | 7/2003 | Watanabe |
| 2003/0145380 A1 | 8/2003 | Schmid |
| 2003/0150060 A1 | 8/2003 | Huang |
| 2003/0160479 A1 | 8/2003 | Minuth et al. |
| 2003/0188382 A1 | 10/2003 | Klamm et al. |
| 2003/0234247 A1 | 12/2003 | Stern |
| 2004/0090093 A1 | 5/2004 | Kamiya et al. |
| 2004/0098991 A1 | 5/2004 | Heyes |
| 2004/0113549 A1 | 6/2004 | Roberts et al. |
| 2004/0164594 A1 | 8/2004 | Stoewe et al. |
| 2004/0177622 A1 | 9/2004 | Harvie |
| 2004/0177876 A1 | 9/2004 | Hightower |
| 2004/0177877 A1 | 9/2004 | Hightower |
| 2004/0195870 A1 | 10/2004 | Bohlender et al. |
| 2004/0238022 A1 | 12/2004 | Hiller et al. |
| 2004/0255364 A1 | 12/2004 | Feher |
| 2005/0011009 A1 | 1/2005 | Wu |
| 2005/0012204 A1 | 1/2005 | Strnad |
| 2005/0056310 A1 | 3/2005 | Shikata et al. |
| 2005/0067862 A1 | 3/2005 | Iqbal et al. |
| 2005/0072165 A1 | 4/2005 | Bell |
| 2005/0076944 A1 | 4/2005 | Kanatzidis et al. |
| 2005/0078451 A1* | 4/2005 | Sauciuc .................... G06F 1/20 361/700 |
| 2005/0086739 A1 | 4/2005 | Wu |
| 2005/0121065 A1 | 6/2005 | Otey |
| 2005/0126184 A1 | 6/2005 | Cauchy |
| 2005/0145285 A1 | 7/2005 | Extrand |
| 2005/0161072 A1 | 7/2005 | Esser et al. |
| 2005/0173950 A1 | 8/2005 | Bajic et al. |
| 2005/0200166 A1 | 9/2005 | Noh |
| 2005/0202774 A1 | 9/2005 | Lipke |
| 2005/0220167 A1 | 10/2005 | Kanai et al. |
| 2005/0251120 A1 | 11/2005 | Anderson et al. |
| 2005/0257532 A1 | 11/2005 | Ikeda et al. |
| 2005/0268956 A1 | 12/2005 | Take |
| 2005/0278863 A1 | 12/2005 | Bahash et al. |
| 2005/0285438 A1 | 12/2005 | Ishima et al. |
| 2005/0288749 A1 | 12/2005 | Lachenbruch |
| 2006/0005548 A1 | 1/2006 | Ruckstuhl |
| 2006/0005944 A1 | 1/2006 | Wang et al. |
| 2006/0053529 A1 | 3/2006 | Feher |
| 2006/0078319 A1 | 4/2006 | Maran |
| 2006/0080778 A1 | 4/2006 | Chambers |
| 2006/0087160 A1 | 4/2006 | Dong et al. |
| 2006/0102224 A1 | 5/2006 | Chen et al. |
| 2006/0118158 A1 | 6/2006 | Zhang et al. |
| 2006/0123799 A1 | 6/2006 | Tateyama et al. |
| 2006/0137099 A1 | 6/2006 | Feher |
| 2006/0137103 A1 | 6/2006 | Feher |
| 2006/0157102 A1 | 7/2006 | Nakajima et al. |
| 2006/0158011 A1 | 7/2006 | Marlovits et al. |
| 2006/0162074 A1 | 7/2006 | Bader |
| 2006/0175877 A1 | 8/2006 | Alionte et al. |
| 2006/0197363 A1 | 9/2006 | Lofy et al. |
| 2006/0200398 A1 | 9/2006 | Botton et al. |
| 2006/0201161 A1 | 9/2006 | Hirai et al. |
| 2006/0201162 A1 | 9/2006 | Hsieh |
| 2006/0214480 A1 | 9/2006 | Terech |
| 2006/0219699 A1 | 10/2006 | Geisel et al. |
| 2006/0225441 A1 | 10/2006 | Goenka et al. |
| 2006/0225773 A1 | 10/2006 | Venkatasubramanian et al. |
| 2006/0237166 A1 | 10/2006 | Otey et al. |
| 2006/0243317 A1 | 11/2006 | Venkatasubramanian |
| 2006/0244289 A1 | 11/2006 | Bedro |
| 2006/0273646 A1 | 12/2006 | Comiskey et al. |
| 2007/0017666 A1 | 1/2007 | Goenka et al. |
| 2007/0035162 A1 | 2/2007 | Bier et al. |
| 2007/0040421 A1 | 2/2007 | Zuzga et al. |
| 2007/0069554 A1 | 3/2007 | Comiskey et al. |
| 2007/0086757 A1 | 4/2007 | Feher |
| 2007/0095378 A1 | 5/2007 | Ito et al. |
| 2007/0095383 A1 | 5/2007 | Tajima |
| 2007/0101602 A1 | 5/2007 | Bae et al. |
| 2007/0107450 A1 | 5/2007 | Sasao et al. |
| 2007/0138844 A1 | 6/2007 | Kim |
| 2007/0145808 A1 | 6/2007 | Minuth et al. |
| 2007/0157630 A1 | 7/2007 | Kadle et al. |
| 2007/0158981 A1 | 7/2007 | Almasi et al. |
| 2007/0163269 A1 | 7/2007 | Chung et al. |
| 2007/0190712 A1 | 8/2007 | Lin et al. |
| 2007/0193279 A1 | 8/2007 | Yoneno et al. |
| 2007/0200398 A1 | 8/2007 | Wolas et al. |
| 2007/0214956 A1 | 9/2007 | Carlson et al. |
| 2007/0227158 A1 | 10/2007 | Kuchimachi |
| 2007/0234742 A1 | 10/2007 | Aoki et al. |
| 2007/0241592 A1 | 10/2007 | Griffin et al. |
| 2007/0251016 A1 | 11/2007 | Feher |
| 2007/0256722 A1 | 11/2007 | Kondoh |
| 2007/0261412 A1 | 11/2007 | Heine |
| 2007/0261413 A1 | 11/2007 | Hatamian et al. |
| 2007/0261548 A1 | 11/2007 | Vrzalik et al. |
| 2007/0262621 A1 | 11/2007 | Dong et al. |
| 2007/0296251 A1 | 12/2007 | Krobok et al. |

(56) References Cited

U.S. PATENT DOCUMENTS

| | | |
|---|---|---|
| 2008/0000025 A1 | 1/2008 | Feher |
| 2008/0022694 A1 | 1/2008 | Anderson et al. |
| 2008/0023056 A1 | 1/2008 | Kambe et al. |
| 2008/0028536 A1 | 2/2008 | Hadden-Cook |
| 2008/0028768 A1 | 2/2008 | Goenka |
| 2008/0028769 A1 | 2/2008 | Goenka |
| 2008/0053108 A1 | 3/2008 | Wen |
| 2008/0053509 A1 | 3/2008 | Flitsch et al. |
| 2008/0077211 A1 | 3/2008 | Levinson et al. |
| 2008/0078186 A1 | 4/2008 | Cao |
| 2008/0084095 A1 | 4/2008 | Wolas |
| 2008/0087316 A1 | 4/2008 | Inaba et al. |
| 2008/0154518 A1 | 6/2008 | Manaka et al. |
| 2008/0155990 A1 | 7/2008 | Gupta et al. |
| 2008/0163916 A1 | 7/2008 | Tsuneoka et al. |
| 2008/0164733 A1 | 7/2008 | Giffin |
| 2008/0166224 A1 | 7/2008 | Giffin |
| 2008/0245092 A1 | 10/2008 | Forsberg et al. |
| 2008/0263776 A1 | 10/2008 | O'Reagan et al. |
| 2008/0289677 A1 | 11/2008 | Bell et al. |
| 2008/0307796 A1 | 12/2008 | Bell et al. |
| 2009/0000031 A1 | 1/2009 | Feher |
| 2009/0000310 A1 | 1/2009 | Bell et al. |
| 2009/0015042 A1 | 1/2009 | Bargheer et al. |
| 2009/0026813 A1 | 1/2009 | Lofy |
| 2009/0033130 A1 | 2/2009 | Marquette et al. |
| 2009/0106907 A1 | 4/2009 | Chambers |
| 2009/0126110 A1 | 5/2009 | Feher |
| 2009/0178700 A1 | 7/2009 | Heremans et al. |
| 2009/0211619 A1 | 8/2009 | Sharp et al. |
| 2009/0218855 A1 | 9/2009 | Wolas |
| 2009/0235969 A1 | 9/2009 | Heremans et al. |
| 2009/0269584 A1 | 10/2009 | Bell et al. |
| 2009/0293488 A1 | 12/2009 | Coughlan, III et al. |
| 2010/0132379 A1 | 6/2010 | Wu |
| 2010/0132380 A1 | 6/2010 | Robinson, II |
| 2010/0133883 A1 | 6/2010 | Walker |
| 2010/0154437 A1 | 6/2010 | Nepsha |
| 2010/0154911 A1 | 6/2010 | Yoskowitz |
| 2010/0198322 A1 | 8/2010 | Joseph |
| 2010/0307168 A1 | 12/2010 | Kohl et al. |
| 2011/0066217 A1 | 3/2011 | Diller et al. |
| 2011/0101741 A1 | 5/2011 | Kolich |
| 2011/0271994 A1 | 11/2011 | Gilley |
| 2011/0289684 A1 | 12/2011 | Parish et al. |
| 2012/0003510 A1 | 1/2012 | Eisenhour |
| 2012/0017371 A1 | 1/2012 | Pollard |
| 2012/0080911 A1 | 4/2012 | Brykalski et al. |
| 2012/0235444 A1 | 9/2012 | Dilley et al. |
| 2012/0239123 A1 | 9/2012 | Weber et al. |
| 2012/0261399 A1 | 10/2012 | Lofy |
| 2012/0289761 A1 | 11/2012 | Boyden et al. |
| 2013/0086923 A1 | 4/2013 | Petrovski et al. |
| 2013/0097776 A1 | 4/2013 | Brykalski et al. |
| 2013/0097777 A1 | 4/2013 | Marquette et al. |
| 2013/0125563 A1 | 5/2013 | Jun |
| 2013/0206852 A1 | 8/2013 | Brykalski et al. |
| 2013/0239592 A1 | 9/2013 | Lofy |
| 2014/0007594 A1 | 1/2014 | Lofy |
| 2014/0026320 A1 | 1/2014 | Marquette et al. |
| 2014/0030082 A1 | 1/2014 | Helmenstein |
| 2014/0062392 A1 | 3/2014 | Lofy et al. |
| 2014/0090513 A1 | 4/2014 | Zhang et al. |
| 2014/0090829 A1 | 4/2014 | Petrovski |
| 2014/0113536 A1 | 4/2014 | Goenka et al. |
| 2014/0131343 A1 | 5/2014 | Walsh |
| 2014/0137569 A1 | 5/2014 | Parish et al. |
| 2014/0159442 A1 | 6/2014 | Helmenstein |
| 2014/0180493 A1 | 6/2014 | Csonti et al. |
| 2014/0187140 A1 | 7/2014 | Lazanja et al. |
| 2014/0194959 A1 | 7/2014 | Fries et al. |
| 2014/0237719 A1 | 8/2014 | Brykalski et al. |
| 2014/0250918 A1 | 9/2014 | Lofy |
| 2014/0256244 A1 | 9/2014 | Sakurai et al. |
| 2014/0260331 A1 | 9/2014 | Lofy et al. |
| 2014/0305625 A1 | 10/2014 | Petrovski |
| 2014/0310874 A1 | 10/2014 | Brykalski et al. |
| 2014/0338366 A1 | 11/2014 | Adldinger et al. |
| 2015/0013346 A1 | 1/2015 | Lofy |
| 2015/0121902 A1 | 5/2015 | Steinman |
| 2015/0238020 A1 | 8/2015 | Petrovski et al. |
| 2016/0030234 A1 | 2/2016 | Lofy et al. |
| 2016/0053772 A1 | 2/2016 | Lofy et al. |
| 2016/0137110 A1 | 5/2016 | Lofy et al. |
| 2016/0320104 A1 | 11/2016 | Lofy |
| 2017/0071359 A1 | 3/2017 | Petrovski et al. |

FOREIGN PATENT DOCUMENTS

| | | |
|---|---|---|
| DE | 195 03 291 | 8/1996 |
| DE | 199 12 764 | 9/2000 |
| DE | 299 11 519 | 11/2000 |
| DE | 102 38 552 | 8/2001 |
| DE | 101 15 242 | 10/2002 |
| DE | 201 20 516 | 4/2003 |
| DE | 10 2009 036 332 | 2/2011 |
| EP | 0 424 160 | 4/1991 |
| EP | 0 411 375 | 5/1994 |
| EP | 0 621 026 | 10/1994 |
| EP | 0 834 421 | 4/1998 |
| EP | 0 862 901 | 9/1998 |
| EP | 1 598 223 | 11/2005 |
| EP | 1 972 312 | 9/2008 |
| EP | 1 845 914 | 9/2009 |
| EP | 2 073 669 | 11/2012 |
| EP | 2 921 083 | 9/2015 |
| FR | 2 893 826 | 6/2007 |
| GB | 874660 | 8/1961 |
| GB | 978057 | 12/1964 |
| JP | 56-097416 | 8/1981 |
| JP | 60-080044 | 5/1985 |
| JP | 60-085297 | 5/1985 |
| JP | 01-281344 | 11/1989 |
| JP | 04-052470 | 6/1990 |
| JP | 04-165234 | 6/1992 |
| JP | 05-026762 | 2/1993 |
| JP | 05-277020 | 10/1993 |
| JP | 10-044756 | 2/1998 |
| JP | 10-227508 | 8/1998 |
| JP | 10-297243 | 11/1998 |
| JP | 10-332883 | 12/1998 |
| JP | 2000-060681 | 2/2000 |
| JP | 2000-164945 | 6/2000 |
| JP | 2001-174028 | 6/2001 |
| JP | 2001-208405 | 8/2001 |
| JP | 2002-514735 | 5/2002 |
| JP | 2002-227798 | 8/2002 |
| JP | 2003-204087 | 7/2003 |
| JP | 2003-254636 | 9/2003 |
| JP | 2004-055621 | 2/2004 |
| JP | 2004-174138 | 6/2004 |
| JP | 2005-079210 | 2/2005 |
| JP | 2005-333083 | 12/2005 |
| JP | 2006-001392 | 1/2006 |
| JP | 2006-021572 | 1/2006 |
| JP | 2006-076398 | 3/2006 |
| KR | 2001-0060500 | 7/2001 |
| LU | 66619 | 2/1973 |
| WO | WO 94/20801 | 9/1994 |
| WO | WO 95/14899 | 6/1995 |
| WO | WO 95/31688 | 11/1995 |
| WO | WO 96/05475 | 2/1996 |
| WO | WO 98/07898 | 2/1998 |
| WO | WO 98/31311 | 7/1998 |
| WO | WO 99/23980 | 5/1999 |
| WO | WO 99/44552 | 9/1999 |
| WO | WO 99/58907 | 11/1999 |
| WO | WO 02/11968 | 2/2002 |
| WO | WO 02/053400 | 7/2002 |
| WO | WO 02/058165 | 7/2002 |
| WO | WO 03/014634 | 2/2003 |
| WO | WO 03/051666 | 6/2003 |

(56) References Cited

FOREIGN PATENT DOCUMENTS

| | | |
|---|---|---|
| WO | WO 03/063257 | 7/2003 |
| WO | WO 2004/011861 | 2/2004 |
| WO | WO 2005/115794 | 12/2005 |
| WO | WO 2006/078394 | 7/2006 |
| WO | WO 2007/060371 | 5/2007 |
| WO | WO 2007/089789 | 8/2007 |
| WO | WO 2008/045964 | 4/2008 |
| WO | WO 2008/046110 | 4/2008 |
| WO | WO 2008/057962 | 5/2008 |
| WO | WO 2008/076588 | 6/2008 |
| WO | WO 2008/086499 | 7/2008 |
| WO | WO 2008/115831 | 9/2008 |
| WO | WO 2009/015235 | 1/2009 |
| WO | WO 2009/036077 | 3/2009 |
| WO | WO 2009/097572 | 8/2009 |
| WO | WO 2010/009422 | 1/2010 |
| WO | WO 2010/088405 | 8/2010 |
| WO | WO 2010/129803 | 11/2010 |
| WO | WO 2011/026040 | 3/2011 |
| WO | WO 2011/156643 | 12/2011 |
| WO | WO 2012/061777 | 5/2012 |
| WO | WO 2013/052823 | 4/2013 |
| WO | WO 2014/164887 | 10/2014 |

OTHER PUBLICATIONS

Feher, Steve, "Thermoelectric Air Conditioned Variable Temperature Seat (VTS) & Effect Upon Vehicle Occupant Comfort, Vehicle Energy Efficiency, and Vehicle Environment Compatibility", SAE Technical Paper, Apr. 1993, pp. 341-349.
Lofy et al., "Thermoelectrics for Environmental Control in Automobiles", Proceeding of Twenty-First International Conference on Thermoelectrics (ICT 2002), 2002, pp. 471-476.
Photographs and accompanying description of climate control seat assembly system components publicly disclosed as early as Jan. 1998.
Photographs and accompanying description of a component of a climate control seat assembly system sold prior to Dec. 20, 2003.
Photographs and accompanying description of a component of a climate control seat assembly system sold prior to Nov. 1, 2005.
International Search Report and Written Opinion received in PCT Application No. PCT/US2007/080990, dated May 7, 2008.
Japanese Office Action re JP Patent Application No. 2011-518941, dated Oct. 18, 2013 in 5 pages, along with its English translation as translated by a foreign associate.
U.S. Appl. No. 15/467,830, filed Mar. 23, 2017, Brykalski et al.
U.S. Appl. No. 15/495,787, filed Apr. 24, 2017, Steinman et al.
International Preliminary Report on Patentability received in PCT Application No. PCT/US2007/080990, dated Apr. 15, 2009.

\* cited by examiner

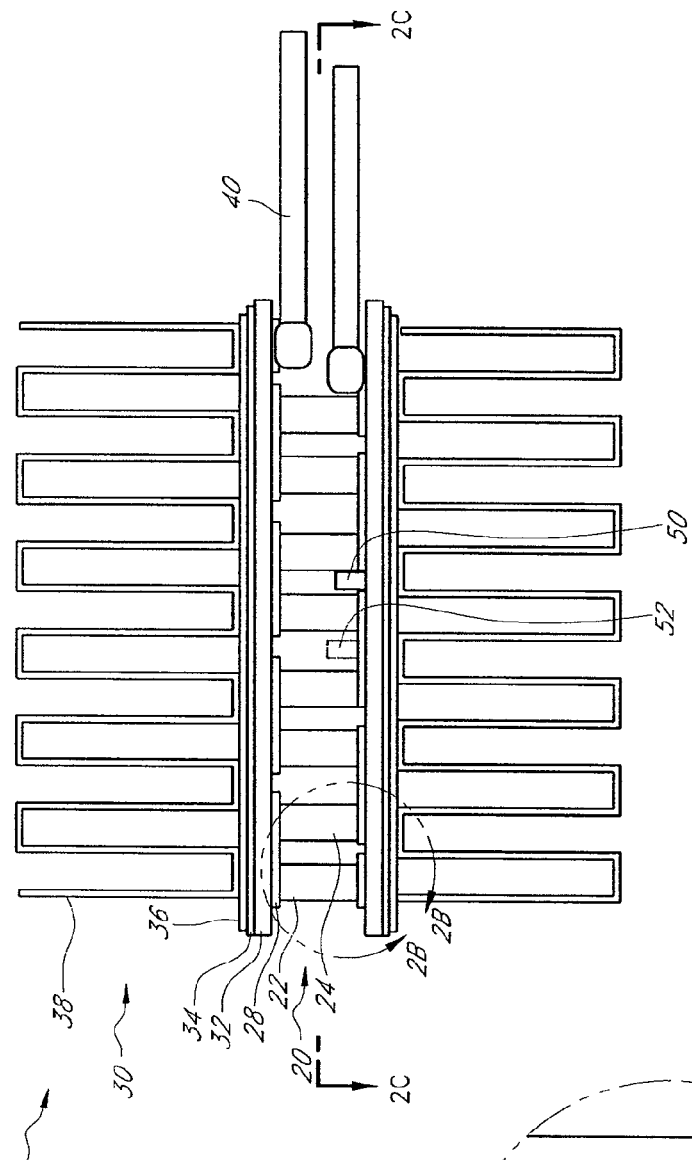
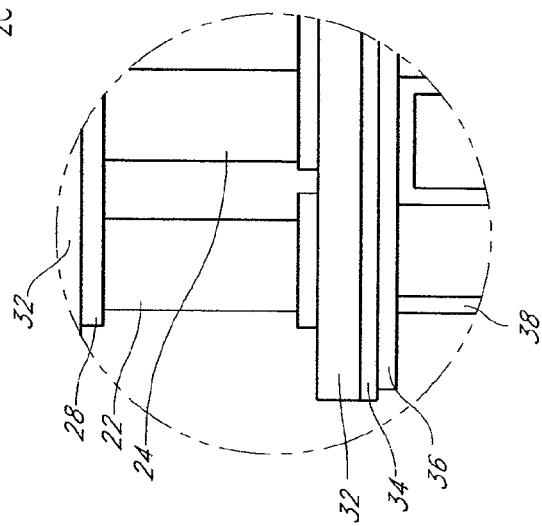
FIG. 2A
FIG. 2B

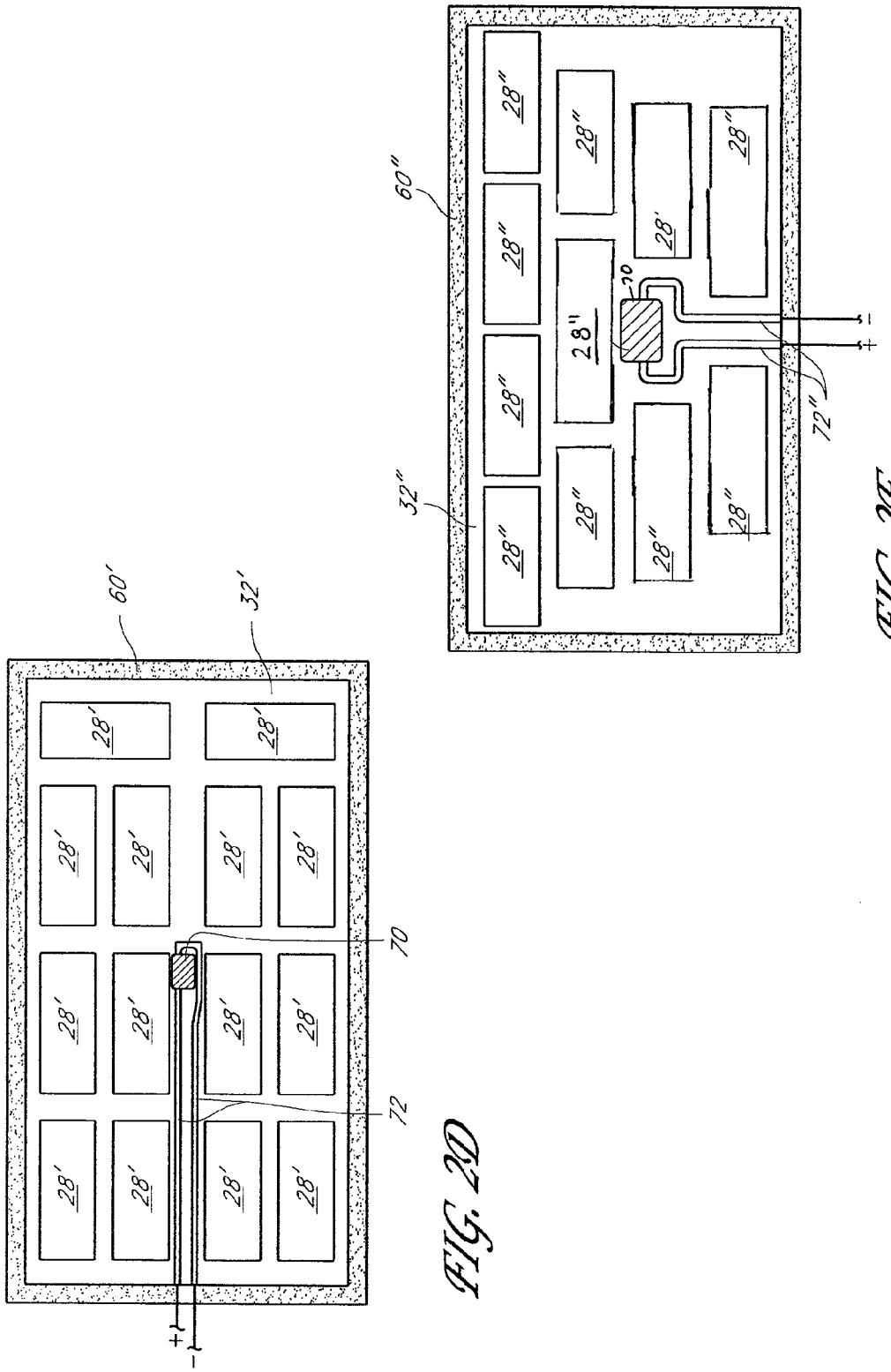

THERMOELECTRIC DEVICE WITH INTERNAL SENSOR

CROSS-REFERENCE TO RELATED APPLICATIONS

This application is a continuation of U.S. patent application Ser. No. 11/546,928, filed on Oct. 12, 2006, the entirety of which is hereby incorporated by reference herein.

BACKGROUND

Field

The present invention relates generally to thermoelectric devices and, more particularly, to a Peltier circuit.

Description of the Related Art

A Peltier circuit is a thermoelectric device comprising two sides. When voltage is applied in one direction, one side creates heat while the other side absorbs heat. Switching polarity of the circuit creates the opposite effect. In a typical arrangement, the Peltier circuit comprises a closed circuit that includes dissimilar materials. As a DC voltage is applied to the closed circuit, a temperature change is produced at the junction of the dissimilar materials. Heat is either emitted or absorbed at the junction depending on the direction of current flow. The Peltier circuit can include several such junctions connected electrically in series. The junctions can be sandwiched between two ceramic plates, which form the cold side and the hot side of the device. The cold side can be thermally coupled to an object to be cooled and the hot side can be thermally coupled to a heat sink which dissipates heat to the environment.

U.S. Patent Publication No. 2006-0130490 (filed Jan. 31, 2005 and published Jun. 22, 2006) discloses a vehicle seat ventilation system that utilizes a Peltier circuit to provide heated and/or cooled air to a vehicle seat for enhancing passenger comfort. Specifically, air can be passed over the cold and/or hot side of the Peltier circuit to heat or cool the air, which is then directed to the vehicle seat. Use of a Peltier circuit is particularly advantageous in this application because the Peltier circuit is compact and allows a single device to provide heated and cooled air to the vehicle seat. That is, the air may be directed over a single surface of the Peltier circuit, and the voltage can be reversed throughout the circuit depending on whether heated or cooled air is desired.

SUMMARY

U.S. Patent Publication No. 2006-0130490 discloses a climate control system that can include a Peltier circuit for cooling and/or heating air supplied to a vehicle seat. A temperature sensor is used to measure the temperature of the air directed to the vehicle seat. Data from the temperature sensor can be used to control the amount and direction of voltage through the Peltier circuit. The temperature sensor should be reliable and provide accurate measurements. Accordingly, it would be desirable to provide a Peltier circuit with an improved arrangement for protecting the temperature sensor.

Accordingly, one aspect of the present invention comprises a thermoelectric device that includes a first and a second substrate spaced apart from each other to form a gap. A plurality of semiconductor elements are disposed between the first and second substrates within the gap. The plurality of semiconductor elements comprise a first group of semiconductor elements having a first set of electrical properties and a second group of semiconductor elements having a second set of electrical properties. A first set of electrical conductors is disposed between the plurality of semiconductors and the first substrate and a second set of electrical conductors are disposed between the plurality of semiconductors and the second substrate. The first set of electrical conductors and the second set of electrical conductors are arranged so the plurality of semiconductor elements are electrically coupled to each other in series with the first and second groups of semiconductor elements in an alternating arrangement. At least one sensor is disposed between the first and second substrates at a location spaced from a peripheral edge of the first and second substrates. A seal extends around the peripheral edge of the first and second substrates.

Another aspect of the present invention comprises a thermoelectric system that includes a pair of opposing substrates, each substrate having a peripheral edge and a face that generally opposes a face of the other opposing substrate. A plurality of semiconductor elements is positioned between the opposing faces. The plurality of semiconductor elements includes at least two dissimilar semiconductor elements, the plurality of semiconductor elements electrically coupled in series by conductor elements arranged so the two dissimilar elements are connected in an alternating pattern. A sensor is positioned between the pair of opposing substrates at a location spaced from the peripheral edges of the opposing substrates. A seal extends around the plurality of semiconductor elements Another aspect of the present invention comprises a climate controlled seat assembly that includes a seat cushion having an outer surface comprising a first side for supporting an occupant in a sitting position and a second side. An air passage extends from the second side into the seat cushion and is configured to deliver air to the first side of the seat cushion. A climate control system is in fluid communication with the air passage. The climate control system includes a thermoelectric device configured to heat and cool air deliver to the air passage. The thermoelectric device includes a pair of opposing substrates. A plurality of semiconductor and connection elements are disposed between the opposing substrates. A sensor is disposed between the pair of opposing substrates. A seal extends around the plurality of semiconductor and connection elements and the sensor.

Yet another aspect of the present invention comprises a thermoelectric system that includes a pair of opposing substrates, each substrate having a peripheral edge and a face that generally opposes a face of the other opposing substrate. A plurality of semiconductor elements are disposed between the substrates elements. The plurality of semiconductor elements comprises at least two groups of dissimilar semiconductor elements that are alternately electrically coupled to each other in series. A sensor is positioned between the pair of opposing substrates at a location spaced from the peripheral edges of the opposing substrates. The system also includes means for sealing from moisture the plurality of semiconductor elements and the sensor positioned between the pair of opposing substrates.

BRIEF DESCRIPTION OF THE DRAWINGS

FIG. 2A is a side view of the thermoelectric apparatus of FIG. 1A;

FIG. 2B is an enlarged view of the portion labeled 2B-2B in FIG. 2A;

FIG. 2D is a modified embodiment of FIG. 2C;

FIG. 2E is a modified embodiment of FIG. 2C;

DETAILED DESCRIPTION

Figure 1A:
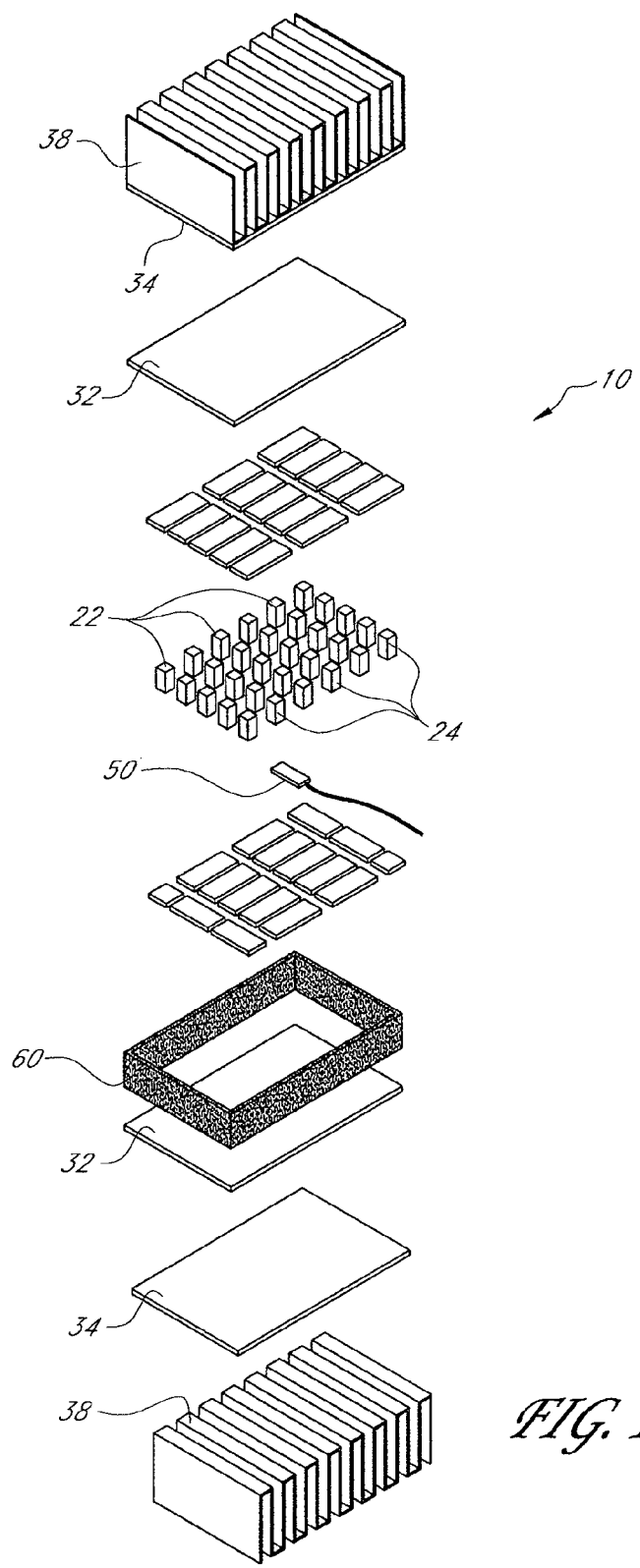
FIG. 1A is an exploded side perspective view of an embodiment of a thermoelectric apparatus.
Figure 1B:
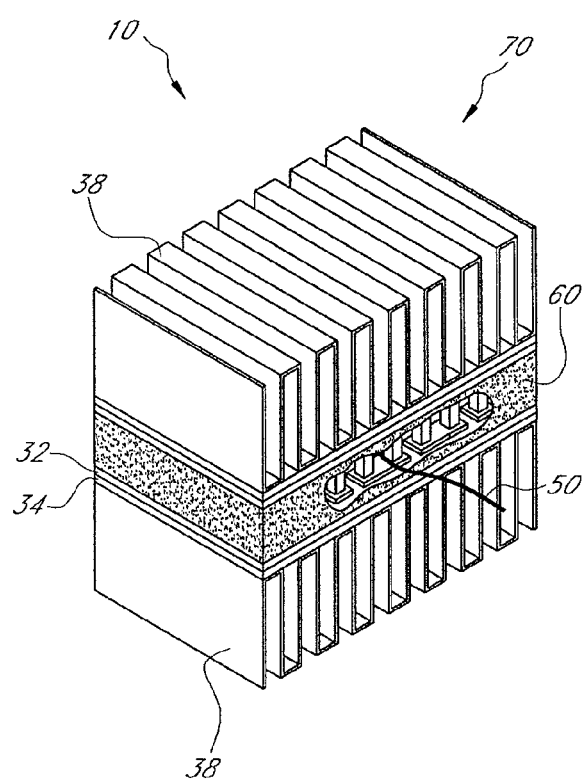
FIG. 1B is a side perspective view of the assembled thermoelectric apparatus of FIG. 1A.

FIGS. 1A, 1B, 2A, and 2B illustrate an embodiment of a thermoelectric device 10. FIG. 1A is an exploded view of the thermoelectric device 10 with its various components separated vertically for ease of inspection. FIG. 1B is a side perspective view of the assembled thermoelectric device 10. FIG. 2A is a side view of the thermoelectric device 10 with portions (as explained below) removed. FIG. 2B is an enlarged view of a portion of FIG. 2A.

With initial reference to FIGS. 1A and 1B, the thermoelectric device 10 can include a plurality of dissimilar conductive elements 22, 24. As will be explained in more detail below, pairs of dissimilar conductive elements 22, 24 can be coupled together by a series 28 of opposing conductor tabs 28, which are, in turn, disposed between a pair of opposing substrates 32. In the illustrated embodiment, each substrate 32 is thermally coupled to a heat transfer member 38 through a thermal conductive element 34. A sensor 50 can be positioned between the opposing substrates 32 and a seal 60 can be provided between the opposing substrates 32 to protect the sensor 50 and the elements between the substrates 32.

FIGS. 2A and 2B are side views of the thermoelectric device with the seal 60 omitted to allow inspection of the components 22, 24, 28 between the substrates 32. In one embodiment, the dissimilar conductors 22, 24 comprise alternating N-type semiconductor elements 22 and P-type semiconductor elements 24. The N-type semiconductor elements 22 and P-type semiconductor elements 24 can be composed of a bismuth-tellurium alloy ($Bi_2Te_3$). Other doped or non-doped metals can also be used. The end of each of the N-type semiconductor elements 22 and P-type semiconductor elements 24 can be coated with a diffusion barrier (not shown). The diffusion barrier can inhibit flow of electrons out of the semiconductor elements 22, 24. The diffusion barrier can comprise any of a number of materials, such as, for example, nickel, a titanium/tungsten alloy, and/or molybdenum.

As can be seen in FIG. 2A, pairs of dissimilar semiconductor elements 22, 24 can be coupled at their tops and bottoms with the conductor elements or tabs 28. Semiconductor elements 22, 24 of the same type are not disposed on the same conductor tab 28. That is, each conductor tab 28 is coupled to only one N-type semiconductor element 22 and only one P-type semiconductor elements 24. In addition, the upper and lower conductor tabs 28 are configured such that the semiconductor elements 22, 24 are disposed in an alternating series. In this manner, the semiconductor elements are electrically connected in series with each other but, with respect to thermal energy, are in parallel with each other.

With continued reference to FIG. 2A, a first N-type semiconductor element 22 can be coupled at its top to a first conductor tab 28 which can also be coupled to a first the P-type semiconductor element 24 to the right of the first N-type semiconductor element 22. At the bottom of the first N-type semiconductor element 22, a second conductor tab 28 can be coupled to the first N-type semiconductor element 22 and can be coupled to a second P-type semiconductor element 24 to be disposed to the left of the first N-type thermoelectric element 22. With reference back to FIG. 1A, the conductor tabs 2a are arranged on the conductor element 28 configured such that all the semiconductor elements 22, 24 are connected in series with each other. It should be appreciated that the conductor tabs 28 can comprise a plurality of discrete elements coupled to the substrate 32 or an intermediate member. In a modified embodiment, the tabs 28 can be formed by tracing or otherwise forming a layer of conductive material on the substrate and/or an intermediate element.

With continued reference to FIG. 2A, the sensor 50 can be disposed on either substrate 32 between the semiconductor elements 22, 24. As will be explained below, the sensor 50 can be position on the substrate 32 between the conductor tabs 28. In dashed lines, FIG. 2A illustrates a sensor 52 in a modified location in which the sensor 52 is positioned on one of the conductor tabs 28.

As mentioned above, heat transfer assemblies 38 can be positioned on the top and bottom sides of the thermoelectric device 10. The thermoelectric device 10 is capable of operating without the heat transfer assemblies 38, however, the presence of such assemblies 38 increases the efficiency of heat transfer from the thermoelectric device 10 to the ambient atmosphere or a fluid in contact with the thermoelectric device 10.

With reference to FIGS. 2A and 2B, an electrically-conducting solder (not shown) can be used to mount the N-type semiconductor elements 22 and P-type semiconductor elements 24 to of the conductor tabs 28. In one embodiment, the conducting solder can comprise compound of tin and antimony, although other metals or non-metals can be used. In one example, bismuth can also be alloyed with tin to create the solder. Other methods of affixing the semiconductor elements 22, 24 to the conductor tabs 28 can be used, provided an electrical connection is permitted between the semiconductor elements 22, 24 and the conductor tabs 28. In turn, the conductor tabs 28 can suitably be mounted to the substrate 32 via an adhesive.

The substrates 32 are preferably configured to provide electrical insulation while providing for heat conduction. In one embodiment, the substrates 32 can be constructed of a ceramic material such as, for example, alumina (ceramic) or silicon. Various other types of materials may be used, such an epoxy. In such an embodiment, the substrates 32 are preferably sufficiently rigid to maintain the shape of the thermoelectric device 10. In other embodiments, flexible substrates can be used. When flexible substrates are used, the thermoelectric device can be constructed in various shapes and have the ability to bend from one shape to another. As mentioned above, the substrates 32 can act an electrical insulator. The typical thickness for a substrate can be between 50 and 500 micrometers, though other thicknesses can be used. In the illustrated embodiment, the substrates 32 can be sufficiently large to cover completely the semiconductor elements 22, 24 and conductor tabs 28. The conductor tabs 28 can be coupled to the electrically-insulating substrate 32 through solder, epoxy, or any other mounting mechanism.

With continued reference to FIGS. 2A and 2B, the heat transfer layer 34 can be disposed between the substrate 32 and the heat transfer member 38. Accordingly, in the illustrated embodiment, the heat transfer layer 34 can be disposed on the outside of each of the substrates 32. In one embodiment, the heat transfer layer 34 can be a plate composed of copper or another material that has high thermal conductivity. The heat transfer layer 34 can be between 10 and 400 micrometers thick, although thinner or thicker layers can be used. The heat transfer member 38 can be coupled to the heat transfer layer by a layer of heat-conducting solder 36. In the illustrated embodiment, the heat transfer member 38 can comprise a material of high thermal conductivity (e.g., copper), which is shaped into a plurality of fins. Other materials or shapes can also be used, such as copper alloys or circular members. Additionally, the heat transfer between the heat transfer member 38 and the surrounding environment can be enhanced by providing a fluid transfer device (e.g., a fan) to move fluid (e.g., air) over and/or through the heat transfer member 38.

When a current is passed through the N-type semiconductor elements 22 in series with the P-type semiconductor elements 24, one junction 28 on one side of the semiconductor elements 22, 24 is heated and the junction 28 on the other side of the thermoelectric elements 22, 24 is cooled. That is, when a voltage is applied in one direction in series through the semiconductor elements 22, 24, alternating junctions 28 of the N-type semiconductor elements 22 and P-type semiconductor elements 24 will heat and cool respectively. With reference to FIG. 2A, because the junctions 28 of the semiconductor elements 22, 24 are located alternately on the top and bottom of the device 10, when a voltage is applied in one direction through the semiconductor elements 22, 24 the top of the thermoelectric device 10 heats and the bottom of the thermoelectric device 10 cools. When the current direction is reversed, the top of the thermoelectric device 10 is cooled and the bottom is heated. Current can be applied to the device 10 through electrical connectors 40, which can be electrically coupled one of the junctions 28.

As described above, the sensor 50 can be disposed between the semiconductor elements 22, 24. The sensor 50 can be configured to determine any of a number of states of operation of the thermoelectric device 10. In the illustrated embodiment, the sensor 50 can be a temperature sensor, such as a thermistor. As an example, a thermistor with an internal resistance of about 1000Ω can be used. Other resistances and other sensors that detect different operating states of the device 10 can also be used, including, but not limited to, thermocouples and resistance thermometers. The sensor 50 can determine the temperature of the thermoelectric device 10 at a point located among the semiconductor elements 22, 24. The sensor 50 can be disposed on a conductor tab 28 (e.g., element 52) between an N-type semiconductor element 22 and a P-type semiconductor element 24, or can be disposed between any two conductor elements 22, 24 while mounted or placed on the substrate 32. In a modified embodiment, the sensor 50 can be disposed between a semiconductor element 22, 24 and the edge of the substrate 32.

Figure 2C:
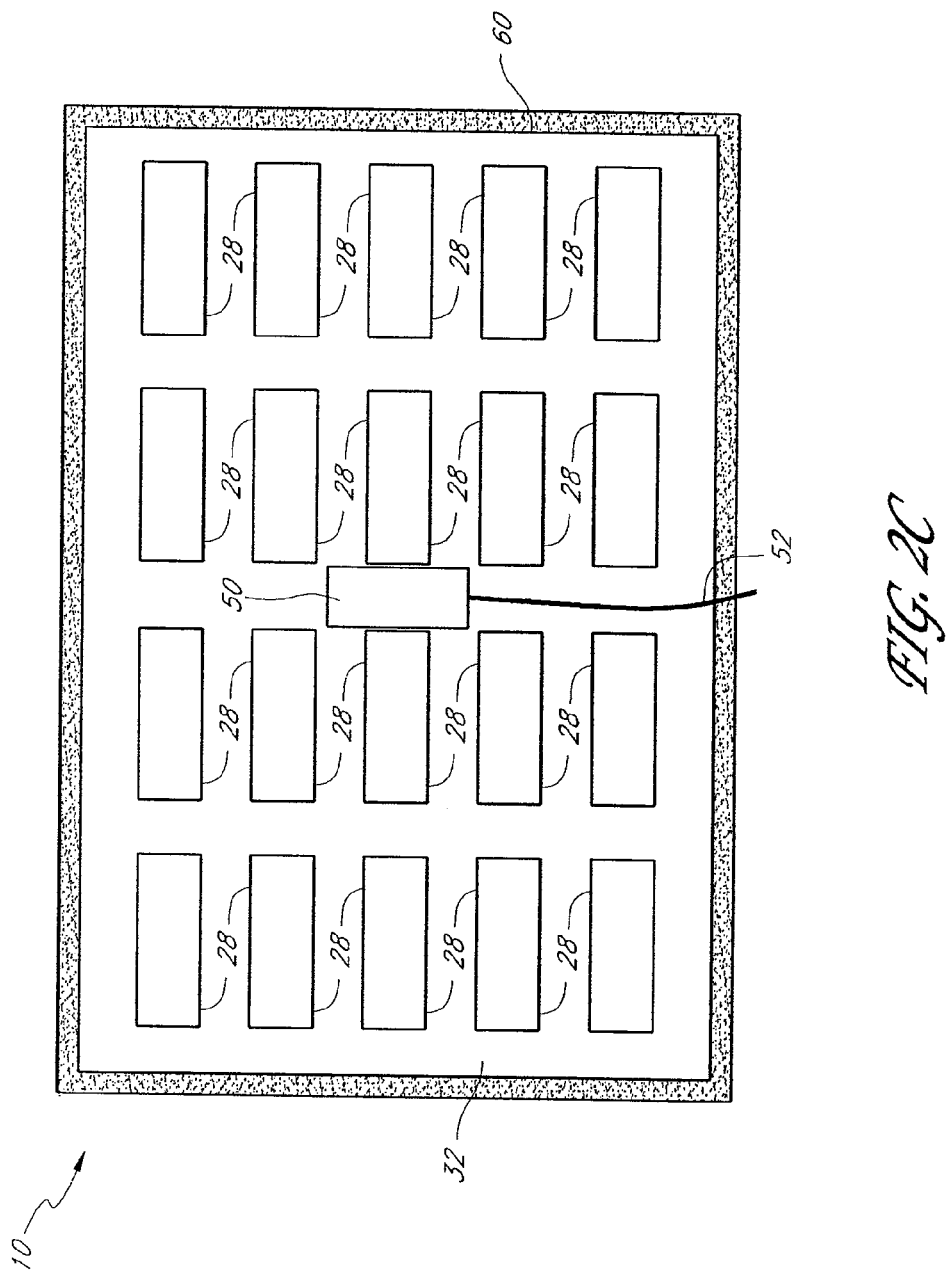
FIG. 2C is a cross-section view taken through line 2C-2C of FIG. 2A with certain portions of the thermoelectric apparatus removed.

With reference back to FIGS. 1A and 1B, the seal 60 is shown surrounding the thermoelectric device 10 between the substrates 32. In general, the seal 60 is disposed between the two substrates 32, and surround the plurality of semiconductor elements 22, 24. FIG. 2C is a top plan view of a bottom half of a thermoelectric device 10. As can be seen, the semiconductor elements 22, 24 can be disposed on the conductor tabs 28 in an alternating pattern. The sensor 50 can be placed on one of the substrates 32 between an N-type thermoelectric element 22 and a P-type thermoelectric element 24. The wire 52 of the internal sensor 50 can extend through the seal 60.

The sensor 50 can have a wire 52 or other communication medium which extends through the seal 60. The seal 60 can be constructed of any material sufficient to inhibit moisture or other contaminants from entering the thermoelectric device 10. In some embodiments, the seal 60 can comprise putty. In other embodiments, plastics or epoxy can be used. In one particular embodiment, RTV, a commercially available silicone rubber sealant, can be used. In one embodiment, the seal 60 can extend completely around the perimeter of thermoelectric device 10 to completely enclose the thermoelectric elements 22, 24 and sensor 50 positioned between the substrate 32. In certain embodiments, the seal 60 can extend at least partially between the substrates 32 and in between the thermoelectric elements 22, 24.

With reference now to FIG. 2D, another embodiment of the thermoelectric device 10 is illustrated. Unless otherwise described, the components in FIG. 2D are substantially identical to those of FIG. 2C an a prime (') has been added to the number. FIG. 2D illustrates a thermoelectric device 10' having a sensor 70 that has a substrate footprint greater than the preferred distance between two thermoelectric elements 22', 24'. Accordingly, some of the thermoelectric elements 22', 24' have been removed to accommodate the sensor 50'. The sensor 50' can be disposed at any location where a thermoelectric element 22', 24' is disposed between the sensor 50' and an edge of the substrate 32'. In the illustrated embodiment, the sensor 50' provides information through a set of connecting traces 72 etched on the substrate 50'. In other embodiments, the wire 52 described above can be used. The thermoelectric elements 22', 24' ordinarily disposed at the location of the connecting traces 72 are removed. In the illustrated embodiment, the connecting traces 72 are composed of a metal, such as copper. Other electrically-conductive materials can also be used, such as gold. In the illustrated embodiment, the connecting traces 72 are in communication with the sensor 50', which is disposed in substantially the center of the substrate 32'. The connecting traces 72 extend from the sensor 50' toward the edge of the substrate 32'.

With reference now to FIG. 2D, another embodiment of the thermoelectric device 10 is illustrated. Unless otherwise described, the components in FIG. 2D are substantially identical to those of FIG. 2C and a prime (') has been added to the number. In the illustrated embodiment, the sensor 70 is disposed between the substrates 32' and conductor elements 28. As illustrated, the connecting traces 72 preferably extend from the sensor 70 towards an edge of the substrate 32' between the conductor elements 28.

With reference now to FIG. 2E, another embodiment of the thermoelectric device 10 is illustrated. Unless otherwise described, the components in FIG. 2D are substantially identical to those of FIG. 2C a double prime (") has been added to the number. FIG. 2E illustrates a thermoelectric device 10 having a sensor 70 that has a substrate footprint greater than the preferred distance between two thermoelectric elements 22', 24'. Accordingly, some of the thermoelectric elements (not shown) and/or conductor element 28" have been removed to accommodate the sensor 70. The sensor 70 can be disposed at any location where a thermoelectric element (not shown) is disposed between the sensor 70 and an edge of the substrate 32'. In the illustrated embodiment, the sensor 70 provides information through a set of connecting traces 72 etched on the substrate 32'. In other embodiments, the wire 52 described above can be used. The thermoelectric elements (not shown) ordinarily disposed at the location of the connecting traces 72 are removed. In the illustrated embodiment, the connecting traces 72 are composed of a metal, such as copper. Other electrically-conductive materials can also be used, such as gold. In the illustrated embodiment, the connecting traces 72 are in communication with the sensor 70, which is disposed in substantially the center of the substrate 32". The connecting traces 72 extend from the sensor 50" toward the edge of the substrate 32'.

Figure 3:
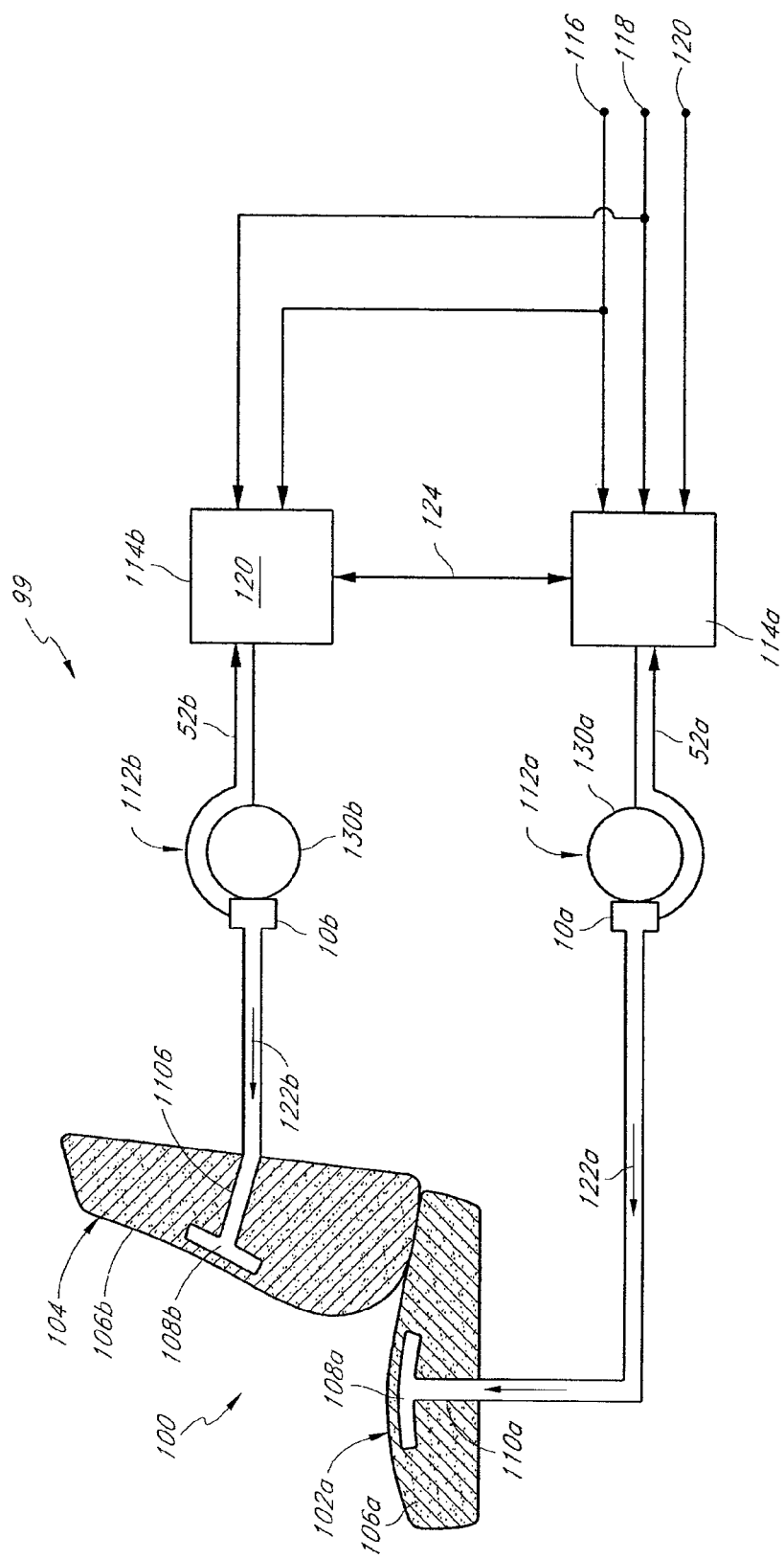
FIG. 3 is a schematic illustration of a ventilation system that includes the thermoelectric apparatus of FIG. 1A.

With reference now to FIG. 3, a climate control system 99 for a seat assembly 100 is shown in combination with a pair of thermoelectric devices 10a, 10b, which can be arranged as described above. In the illustrated embodiment, the seat assembly 100 is similar to a standard automotive seat. However, it should be appreciated that certain features and aspects of the climate control system 99 and seat assembly 100 described herein can also be used in a variety of other applications and environments. For example, certain features and aspects of the system 99 and assembly 100 may be adapted for use in other vehicles, such as, for example, an airplane, a wheel chair, a boat, or the like. Further, certain features and aspects of the system 99 and assembly 100 can also be adapted for use in stationary environments, such as, for example, a chair, a sofa, a theater seat, a mattress, and an office seat that is used in a place of business and/or residence.

The seat assembly 100 can comprise a seat portion 102 and a back portion 104. The seat portion 102 and back portion 104 can each comprise a cushion 106a, 106b and a plurality of channels 108a, 108b disposed within and/or extending through the cushions 106a, 106b. Each of the channels 108a, 108b can be placed in fluid communication with the climate control system 99 through a conduit 110a, 110b. The conduits 110a, 110b, in turn, are in communication with separate climate control devices 112a, 112b. In the illustrated embodiment, the channels 108a associated with the seat portion 102 are in communication with a different climate control device 112a than the channels 108b in the back portion. However, in other embodiments, a single climate control device can be in fluid communication with the channels 108a, 108b the seat portion 102 and back portion 104. In other embodiments, multiple climate control devices can be associated with either the seat portion 102 and/or the back portion 104. In some embodiments, the channels 108a, 108b and/or conduits 110a, 110b can include resistive heating elements (not shown).

In the illustrated embodiment, the climate control devices 112a, 112b can each comprise the thermoelectric device 10a, 10b, which can be configured as described above, and a fluid transfer device 130a, 130b. The fluid transfer device 130a, 130b can be a radial or axial fan, or other device for transferring a fluid. The thermoelectric device 10a, 10b can be disposed between the fluid transfer device 130a, 130b and the conduits 110a, 110b. As described above, the thermoelectric device 10a, 10b can be configured to selectively heat or cool the fluid (e.g., air) delivered by the fluid transfer device 130a, 130b to the seat portion 102 and back portion 104. The fluid transfer device 130a, 130b can be configured to transfer air to the channels 108a, 108b that is drawn past only one side of the thermoelectric device 10a, 10b. Accordingly, the climate control devices 112a, 112b can be configured to alternately supply heated or cooled air 122a, 122b through the plurality of conduits 110a, 110b to the seat 100. The fluid transfer device 130a, 130b can also be used to withdraw air through the conduits 110a, 110b.

In the illustrated embodiments, each of the thermoelectric devices 10a, 10b include a pair of heat transfer members 38 (not shown in FIG. 3) as described above. The heat transfer members 38 form a waste heat exchanger and a generally opposing main heat exchanger, which can be thermally exposed to the air transferred by the fluid transfer device 130a, 130b. Depending upon the mode of operation, heat can be transferred to the air through the main heat exchanger or withdrawn from the air through the main heat exchanger.

The climate control devices 112a, 112b can be controlled and operatively connected by an electronic control device 114a, 114b. The electronic control devices 114a, 114b can receive signals from a plurality of input sources 116, 118, 120. In the illustrated embodiment, three input sources are shown, but more or fewer can be used. The electronic control devices 114a, 114b can be operatively connected with each other through an information connection 124. The electronic control devices 114a, 114b can be configured change the operating state of the climate control devices 112a, 112b in response to a control signal or setting. For example, the electronic control devices 114a, 114b can alter the speed at which fluid is transferred by the fluid transfer devices 130a, 130b or the operating state of the thermoelectric devices 10a, 10b to heat or cool the fluid. The sensor 50 (not shown in FIG. 3) disposed in the thermoelectric devices 10a, 10b can impart information through the wire 52a, 52b to the electronic control devices 114a, 114b, thereby allowing the devices 114a, 114b to determine accurately the operating temperature of the climate control devices 112a, 112b. The electronic control devices 114a, 114b can adjust the operation of the climate control devices 112a, 112b based at least in part on information provided by the sensor 50. For example, the electronic control devices 114a, 114b can change the direction or strength of current in the thermoelectric devices 10a, 10b, change the speed of operation of the fluid transfer device 130a, 130b, and/or shut down the devices 10a, 10b if there is a malfunction.

Figure 4:
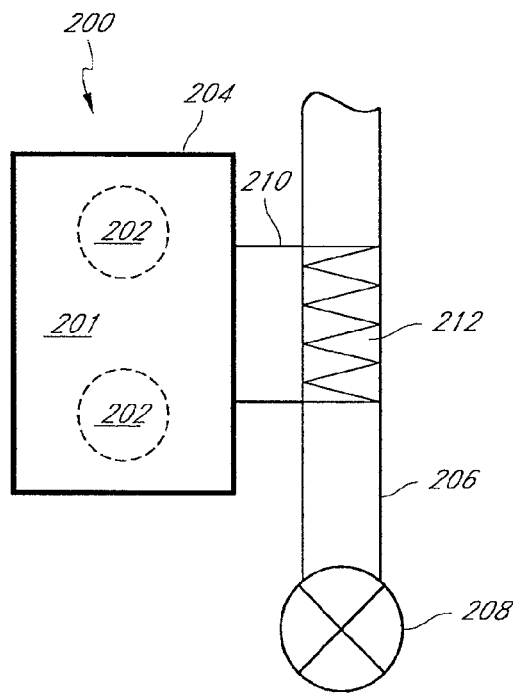
FIG. 4 is a schematic illustration of a conditioned assembly that includes the thermoelectric apparatus of FIG. 1A.

With reference now to FIG. 4, an assembly 200 is shown in combination with a thermoelectric device 210, which can be arranged according to the embodiment described above. In the illustrated embodiment, the assembly 200 defines a cavity 201, which can be enclosed (e.g., via a removable or retractable door or top). In a modified embodiment, the assembly 200 can device one or more holders 202 for containers (e.g., a cup holder). In either embodiment, the assembly 200 preferably includes one or more conductive elements or material 204 that surrounds at least partially cavities 201, 202 so as to cool (or heat) articles positioned therein.

Figure 5:
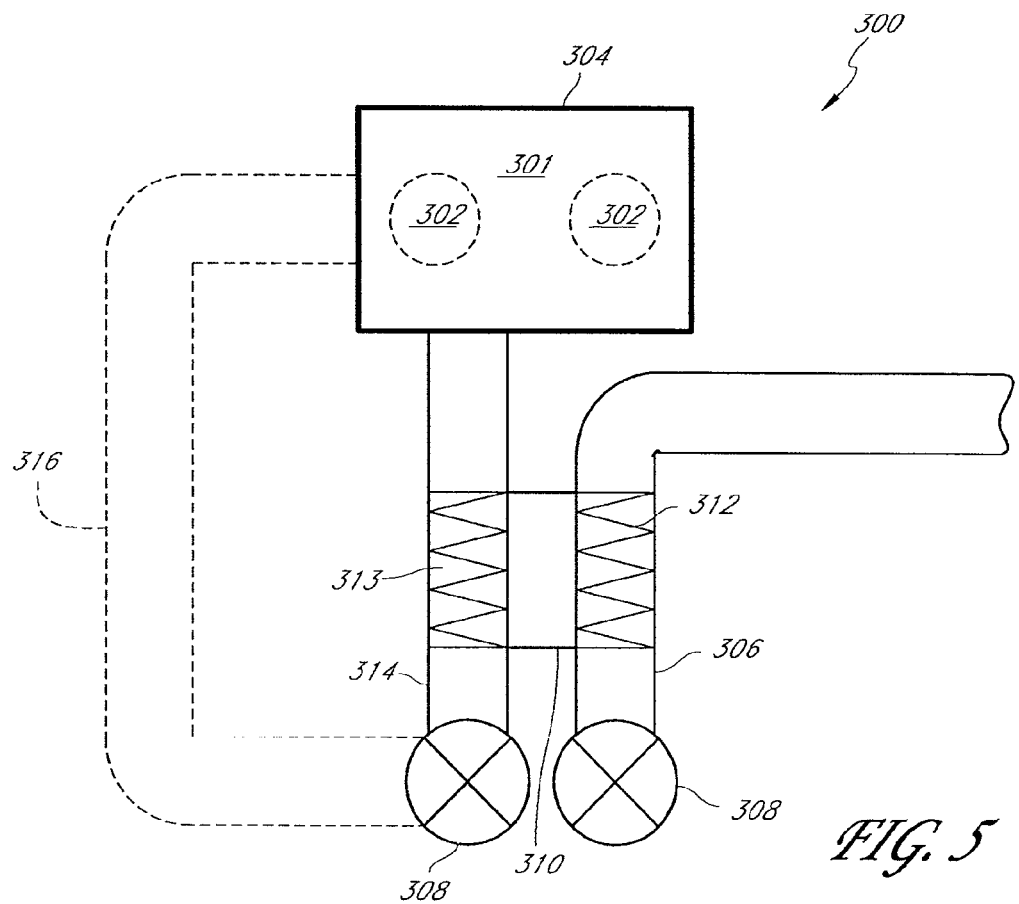
FIG. 5 is a schematic illustration of another embodiment of a conditioned assembly that includes the thermoelectric apparatus of FIG. 1A.

The conductive material or elements 204 can be conductively coupled to the one side of the thermoelectric device 210 while the other side of the device 210 can be conductively coupled to a heat exchanger 212 positioned within a duct 206. A fluid transfer device 208 can be used to pump air through the heat exchanger 212. In this manner, the thermoelectric device 210 can be used to withdraw heat from the cup holder 203 or cavity 201 to cool a container or article positioned therein and/or transfer heat to the cup holder 203 or cavity 201 to heat a container positioned FIG. 5 illustrates a modified embodiment of the assembly 230. As described above, the assembly can include a cavity 301, which can be enclosed (e.g., via a removable or retractable door or top). In a modified embodiment, the assembly 300 can include one or more holders 303 for containers (e.g., a cup holder). Insulation 304 can be provided to insulate the cavity 301 or cup holder 303. In this embodiment, the thermoelectric device 310 has a first side coupled to a first heat exchanger 313 and a second side coupled to a second heat exchanger 312. Each heat exchanger 313, 312 is positioned within a duct 314, 306. Each duct 313, 306 can be in communication with a fluid transfer device 308 or share a common fluid transfer device (not illustrated). The air on the first side of the device 313 is directed into the cavity 201, 202. In this manner, conditioned (e.g., hot or cold) air can be directed into the assembly 300 to cool and/or heat objects and article positioned therein. As shown by the dashed lines, in one embodiment, the air delivered to the cavity 301, 302 can be re-circulated to the fluid transfer device 308 through a recirculation passage 316.

Various components are described as being "operatively connected" to the control unit. It should be appreciated that this is a broad term that includes physical connections (e.g., electrical wires or hard wire circuits) and non-physical connections (e.g., radio or infrared signals). It should also be appreciated that "operatively connected" includes direct connections and indirect connections (e.g., through additional intermediate device(s)).

Although this invention has been disclosed in the context of certain preferred embodiments and examples, it will be understood by those skilled in the art that the present invention extends beyond the specifically disclosed embodiments to other alternative embodiments and/or uses of the invention and obvious modifications and equivalents thereof. In addition, while the number of variations of the invention have been shown and described in detail, other modifications, which are within the scope of this invention, will be readily apparent to those of skill in the art based upon this disclosure. It is also contemplated that various combinations or subcombinations of the specific features and aspects of the embodiments may be made and still fall within the scope of the invention. Accordingly, it should be understood that various features and aspects of the disclosed embodiments can be combined with, or substituted for, one another in order to perform varying modes of the disclosed invention. Thus, it is intended that the scope of the present invention herein disclosed should not be limited by the particular disclosed embodiments described above, but should be determined only by a fair reading of the claims.

What is claimed is:

1. A thermoelectric device comprising:
    a first and a second substrate spaced apart from each other to form a gap;
    a plurality of semiconductor elements disposed between the first and second substrates within the gap, the plurality of semiconductor elements comprising a first group of semiconductor elements having a first set of electrical properties and a second group of semiconductor elements having a second set of electrical properties;
    a first set of electrical conductors disposed between the plurality of semiconductor elements and the first substrate and a second set of electrical conductors disposed between the plurality of semiconductor elements and the second substrate, the first set of electrical conductors and the second set of electrical conductors arranged so the plurality of semiconductor elements are electrically coupled to each other in series with the first and second groups of semiconductor elements in an alternating arrangement,
    wherein the first group of semiconductor elements comprises N-type semiconductor elements and wherein the second group of semiconductor elements comprises P-type semiconductor elements, each electrical conductor being coupled to at least one N-type semiconductor element and at least one P-type semiconductor element to form a Peltier circuit, and
    wherein the first set of electrical conductors are coupled to the first substrate, and the second set of electrical conductors are coupled to the second substrate;
    a sensor disposed between the first and second substrates at a location spaced from a peripheral edge of the first substrate or the second substrate, wherein the sensor is located adjacent to at least two semiconductor elements and is located between the first and second substrates along a surface of at least one of the first and second substrates; and
    a seal extending along the peripheral edge, the seal extending between the first and second substrates and surrounding the semiconductor elements and the sensor, the seal extending from the peripheral edge of the first or second substrate to the other substrate,
    wherein the plurality of semiconductor elements are arranged so that at least some of the semiconductor elements establish an outer boundary along a periphery of the semiconductor elements,
    wherein the outer boundary defines a generally rectangular interior area,
    wherein the plurality of semiconductor elements positioned along the outer boundary surround at least one row of interior semiconductor elements, each of the interior semiconductor elements being positioned within the generally rectangular interior area, and
    wherein the sensor is disposed generally between at least two interior semiconductor elements, such that the sensor is separated from the seal by at least one row of semiconductor elements.

2. The thermoelectric device of claim 1, the seal extends in between at least two of the plurality of semiconductor elements.

3. The thermoelectric device of claim 1, wherein the seal is not in contact with the sensor.

4. The thermoelectric device of claim 1, wherein the sensor is located equivalent of at least one row of semiconductor elements away from any portion of the peripheral edge.

5. The thermoelectric device of claim 1, wherein the sensor is enclosed by at least one row of semiconductor elements on all sides of the sensor such that the plurality of semiconductor elements surrounds the sensor.

6. The thermoelectric device of claim 1, wherein the seal is positioned substantially within the peripheral edge.

7. The thermoelectric device of claim 1, wherein the sensor is a temperature sensor.

8. The thermoelectric device of claim 1, wherein the sensor comprises a thermistor or thermocouple.

9. The thermoelectric device of claim 1, wherein the sensor is disposed, with respect to the peripheral edge, at substantially the center of one of the first and second substrates.

10. The thermoelectric device of claim 1, further comprising at least one heat transfer member coupled to at least one of the first and second substrates.

11. The thermoelectric device of claim 1, wherein the seal completely encloses all of the plurality of semiconductor elements positioned between the first and second substrates.

12. The thermoelectric device of claim 1,
    wherein the thermoelectric device comprises a semiconductor-free region within the interior area, the semiconductor-free region representing a space in which at least one semiconductor element is removed or is never provided;

wherein the sensor is positioned within the semiconductor-free region; and wherein a length of the space created by the semiconductor-free region is greater than a distance separating adjacent semiconductor elements located away from the semiconductor-free region.

13. A thermoelectric system comprising:

a pair of opposing substrates, each substrate having a peripheral edge and a face that generally opposes a face of the other opposing substrate;

a plurality of semiconductor elements are positioned between the opposing faces of the opposing substrates, the plurality of semiconductor elements comprises at least two groups of dissimilar semiconductor elements, the plurality of semiconductor elements electrically coupled in series by conductor elements arranged so the two groups of dissimilar semiconductor elements are connected in an alternating pattern, the conductor elements being coupled to the opposing substrates, wherein the semiconductor elements are arranged in a plurality of parallel rows, wherein at least some of the semiconductor elements form an outer peripheral boundary that defines an interior region within which all remaining semiconductor elements are positioned, and wherein a temperature gradient is created between a first side of the thermoelectric system, adjacent one of the opposing substrates, and a second side of the thermoelectric system, adjacent the other of the opposing substrates, when electrical current is delivered through the semiconductor elements;

a sensor positioned between the pair of opposing substrates at a location spaced from the peripheral edges of the opposing substrates, the sensor being disposed within the interior region and between two of the plurality of semiconductor elements positioned within the interior region, wherein the sensor is positioned adjacent at least one of the pair of opposing substrates; and a seal extending around the plurality of semiconductor elements, the seal positioned between the opposing substrates and within an interior space defined by the peripheral edges of the opposing substrates the seal extending between the peripheral edges of the opposing substrates, wherein at least one row of semiconductor elements separates the sensor from the seal.

14. The thermoelectric system of claim 13, the seal extends in between at least two of the plurality of semiconductor elements.

15. The thermoelectric system of claim 13, wherein the seal is not in contact with the sensor.

16. The thermoelectric system of claim 13, wherein the sensor is located equivalent of at least one row of semiconductor elements away from any portion of the peripheral edges.

17. The thermoelectric system of claim 13, wherein the sensor is enclosed by at least one row of semiconductor elements on all sides of the sensor such that the plurality of semiconductor elements surrounds the sensor.

18. The thermoelectric system of claim 13, wherein the seal is positioned substantially within the peripheral edges.

19. The thermoelectric system of claim 13, wherein the sensor is configured to detect temperature.

20. The thermoelectric system of claim 13, wherein the sensor comprises a thermistor or a thermocouple.

21. A thermoelectric device comprising:

a first substrate and a second substrate spaced apart from each other;

a plurality of semiconductor elements disposed between the first and second substrates, the semiconductor elements comprising a plurality of N-type semiconductor elements and a plurality of P-type semiconductor elements;

a first set of conductor tabs disposed between the plurality of semiconductor elements and the first substrate;

a second set of conductor tabs disposed between the plurality of semiconductor elements and the second substrate, the first set of conductor tabs and the second set of conductor tabs being arranged so the plurality of semiconductor elements are electrically coupled to each other in series, wherein the N-type semiconductor elements and the P-type semiconductor elements are electrically coupled to each in an alternating arrangement, wherein each conductor tab is coupled to one N-type semiconductor element and one P-type semiconductor element to form a Peltier circuit, wherein the first set of conductor tabs are coupled to the first substrate, and the second set of conductor tabs are coupled to the second substrate, wherein the semiconductor elements are located within an area generally bounded by an outer periphery of the first substrate or the second substrate, wherein the semiconductor elements are either peripheral semiconductor elements or interior semiconductor elements, wherein the peripheral semiconductor elements comprise semiconductor elements that are oriented along the outer periphery, and wherein the peripheral semiconductor elements define an interior region, wherein all interior semiconductor elements are positioned within the interior region within the peripheral semiconductor elements;

a temperature sensor disposed between the first and second substrates at a location spaced from the outer periphery, wherein the temperature sensor is positioned adjacent to at least one interior semiconductor element and is positioned within the interior region;

at least one heat exchanger coupled to at least one of the first or second substrates; and a seal extending around the plurality of semiconductor elements, the seal extending from an interior surface of the first substrate to an interior surface of the second substrate at the outer periphery, wherein the interior surface of the first substrate faces the interior surface of the second substrate, wherein the temperature sensor is positioned adjacent along the first or second substrate so as to detect either a heated or cooled side of the thermoelectric device.

22. The thermoelectric device of claim 21, wherein the temperature sensor is located within a semiconductor-free region, the semiconductor-free region being located within the interior region.

23. The thermoelectric device of claim 21, the seal extends in between at least two of the plurality of semiconductor elements.

24. The thermoelectric device of claim 21, wherein the seal is not in contact with the temperature sensor.

25. The thermoelectric device of claim 21, wherein the temperature sensor is located equivalent of at least one row of semiconductor elements away from any portion of the outer periphery.

* * * * *